United States Patent
Takahashi et al.

(10) Patent No.: US 12,007,283 B2
(45) Date of Patent: Jun. 11, 2024

(54) INFRARED SENSOR AND INFRARED SENSOR ARRAY

(71) Applicant: Panasonic Intellectual Property Management Co., Ltd., Osaka (JP)

(72) Inventors: Kouhei Takahashi, Osaka (JP); Naoki Tambo, Kyoto (JP); Kunihiko Nakamura, Osaka (JP); Masaki Fujikane, Osaka (JP); Yasuyuki Naito, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 401 days.

(21) Appl. No.: 17/347,467

(22) Filed: Jun. 14, 2021

(65) Prior Publication Data

US 2021/0302236 A1 Sep. 30, 2021

Related U.S. Application Data

(63) Continuation of application No. PCT/JP2019/037205, filed on Sep. 24, 2019.

(30) Foreign Application Priority Data

Feb. 28, 2019 (JP) ................ 2019-035360

(51) Int. Cl.
*H10N 19/00* (2023.01)
*G01J 5/22* (2006.01)
*G01J 5/20* (2006.01)

(52) U.S. Cl.
CPC ............... *G01J 5/22* (2013.01); *H10N 19/00* (2023.02); *G01J 2005/206* (2013.01)

(58) Field of Classification Search
CPC ........ G01J 5/22; G01J 2005/206; G01J 5/024; G01J 5/0813; G01J 5/20; H10N 19/00; H10N 15/00; H01L 27/144
See application file for complete search history.

(56) References Cited

U.S. PATENT DOCUMENTS 5,656,816 A 8/1997 Tanaka
5,912,464 A 6/1999 Vilain et al.
(Continued)

FOREIGN PATENT DOCUMENTS

CN 107490437 A 12/2017
EP 1072875 A1 1/2001
(Continued)

OTHER PUBLICATIONS

International Search Report of PCT application No. PCT/JP2019/037205 dated Dec. 24, 2019.
(Continued)

*Primary Examiner* — David P Porta
*Assistant Examiner* — Mamadou Faye
(74) *Attorney, Agent, or Firm* — Rimon P.C.

(57) ABSTRACT

Each of first and second beams has a connection portion connected to a base substrate and a separated portion away from the base substrate, and is physically joined to an infrared receiver at the separated portion. The infrared receiver is supported by the first and second beams, and includes lower electrode, upper electrode, and a resistance change film. The resistance change film is sandwiched by the lower electrode and upper electrode in a thickness direction, each of the lower and upper electrodes is electrically connected to the resistance change film, the lower and upper electrodes are electrically connected to first wiring and second wiring, respectively, at least one electrode selected from the lower electrode and the upper electrode (Continued)

has a line-and-space structure, and an infrared reflection film is provided at a position on a surface of the base substrate facing the infrared receiver.

17 Claims, 18 Drawing Sheets

(56) References Cited

U.S. PATENT DOCUMENTS

| | | | |
|---|---|---|---|
| 2007/0120059 A1* | 5/2007 | Tailhades | C01G 49/0063 |
| | | | 250/338.3 |
| 2010/0230595 A1* | 9/2010 | Uchida | H01L 27/14665 |
| | | | 250/338.4 |
| 2011/0291012 A1* | 12/2011 | Takahashi | G01J 5/12 |
| | | | 250/336.1 |
| 2014/0042324 A1 | 2/2014 | Kropelnicki et al. | |
| 2015/0015930 A1 | 1/2015 | Hussein et al. | |
| 2017/0191868 A1* | 7/2017 | Kurth | H01L 27/14618 |
| 2017/0356806 A1* | 12/2017 | Takahashi | G01J 5/12 |
| 2018/0266945 A1* | 9/2018 | Kitaura | H01Q 1/24 |

FOREIGN PATENT DOCUMENTS

| | | |
|---|---|---|
| JP | 5-231946 A | 9/1993 |
| JP | 6-043017 | 2/1994 |
| JP | 7-128150 A | 5/1995 |
| JP | 8-201177 | 8/1996 |
| JP | 9-015039 | 1/1997 |
| JP | 2001-272271 | 10/2001 |
| JP | 2003-106896 A | 4/2003 |
| JP | 2008-003081 | 1/2008 |
| JP | 2008-082790 | 4/2008 |
| JP | 2017-223644 | 12/2017 |
| WO | 2016/021266 | 2/2016 |

OTHER PUBLICATIONS

Andrey Kosarev et al., "Un-cooled Micro-bolometer with Sandwiched Thermo-sensing Layer Based on Ge Films Deposited by Plasma", Mater. Res. Soc. Symp. Proc. vol. 910, Jan. 2006, 0910-A17-05.
Partial European Search Report (R.164 EPC) dated Apr. 4, 2022 for the related European Patent Application No. 19917332.9.
English Translation of Chinese Search Report dated Sep. 8, 2023 for the related Chinese Patent Application No. 201980075092.0.

* cited by examiner

INFRARED SENSOR AND INFRARED SENSOR ARRAY

BACKGROUND

1. Technical Field

The present disclosure relates to an infrared sensor and an infrared sensor array.

2. Description of the Related Art

In the field of infrared sensors, there has been proposed a structure in which an infrared receiver is disposed to be away from the base substrate by using beams. This structure aims at thermally insulating the infrared receiver from the base substrate. In an infrared sensor having this structure, the higher the thermal insulation performance of the beams is, the more the infrared-light receiving sensitivity is improved. Japanese Unexamined Patent Application Publication No. 2017-223644 (hereinafter referred to as PTL 1) discloses a technique of using a phononic crystal structure to increase the thermal insulation performance of the beams.

There is a type of an infrared sensor called a bolometer sensor. The bolometer sensor is also referred to as a thermistor sensor. The infrared receiver of a bolometer sensor includes a resistance change material the electrical resistance of which changes with temperature. The infrared sensor disclosed in PTL 1 includes a bolometer sensor.

A. Kosarev et al., "Un-cooled Micro-bolometer with Sandwiched Thermo-sensing Layer Based on Ge Films Deposited by Plasma", Mater. Res. Soc. Symp. Proc. Vol. 910, 2006, 0910-A17-05 (hereinafter referred to as NPL 1) discloses a bolometer infrared sensor including an infrared receiver including a lower electrode, an upper electrode, and a resistance change film including a resistance change material. The infrared sensor of NPL 1 has a "sandwich structure" in which the resistance change film is sandwiched by the lower electrode and the upper electrode in the thickness direction.

SUMMARY

One non-limiting and exemplary embodiment provides a technique to increase the infrared-light receiving sensitivity of a bolometer infrared sensor.

In one general aspect, the techniques disclosed here feature an infrared sensor including: a base substrate; a bolometer infrared receiver; a first beam; a second beam; first wiring; second wiring; and an infrared reflection film, in which each of the first beam and the second beam has a connection portion connected to the base substrate and/or a member on the base substrate and a separated portion away from the base substrate, and is physically joined to the infrared receiver at the separated portion, the infrared receiver is supported by the first beam and the second beam to be away from the base substrate, the infrared receiver includes a lower electrode, an upper electrode, and a resistance change film including a resistance change material an electrical resistance of which changes with temperature, the resistance change film is sandwiched by the lower electrode and the upper electrode in a thickness direction, each of the lower electrode and the upper electrode is electrically connected to the resistance change film, the lower electrode and the upper electrode are electrically connected to the first wiring and the second wiring, respectively, at least one electrode selected from the lower electrode and the upper electrode has a line-and-space structure, and the infrared reflection film is provided at a position on a surface of the base substrate facing the infrared receiver.

The infrared sensor of the present disclosure is a bolometer sensor that can have a high infrared-light receiving sensitivity.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1A:
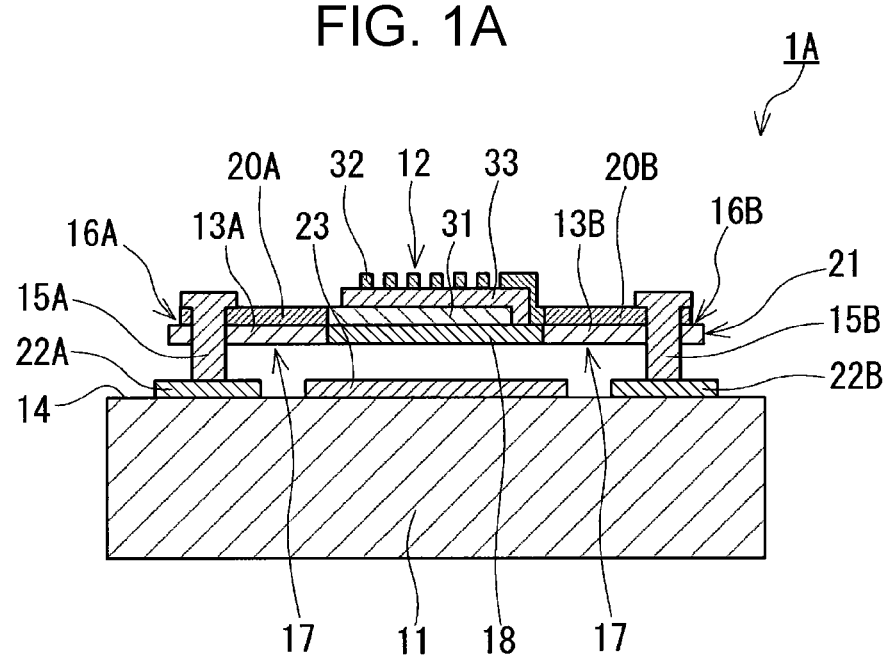
FIG. 1A is a schematic cross-sectional view of an infrared sensor of embodiment 1.

Underlying Knowledge Forming Basis of Present Disclosure

According to study of the inventors, the infrared-light receiving sensitivity of a bolometer infrared sensor is improved not only by improving the thermal insulation performance of the beams but also by reducing the thermal noise $N_{therm}$. The thermal noise $N_{therm}$ is a parameter proportional to the ½ power of the total electric resistance $R_{all}$ of the infrared sensor. The infrared receiver of the infrared sensor of the present disclosure includes a lower electrode, an upper electrode, and a resistance change film and has a structure in which the resistance change film is sandwiched by the lower electrode and the upper electrode in the thickness direction. This structure makes it possible to make the cross-sectional area of the current path in the resistance change film wider and make the path length shorter. Thus, it is possible to reduce the electrical resistance of the resistance change film. The reduction of the electrical resistance of the resistance change film reduces the total electric resistance $R_{all}$ of the infrared sensor and reduces the thermal noise $N_{therm}$. Thus, the above structure will improve the infrared-light receiving sensitivity.

Meanwhile, a bolometer infrared sensor has in general an infrared reflection film at a position on the surface of the base substrate facing the infrared receiver for the purpose of increasing the amount of infrared light absorbed by the infrared receiver. In addition, not only the infrared reflection film is simply provided, but also the separation distance between the infrared reflection film and the infrared receiver is controlled to achieve phases matching between the infrared light incident on the infrared receiver from the outside, the infrared light reflected on the upper surface of the infrared receiver, and the infrared light incident on the infrared receiver from the base substrate side after reflected on the infrared reflection film. This phase matching is important to increase the amount of infrared light absorption. According to the study of the inventors, in the case where the lower electrode and the upper electrode spread on the resistance change film in the shape of a plane are used in the above structure, multiple reflections of infrared light between the lower electrode and the upper electrode makes the above phase matching difficult. Unlike this case, in the infrared receiver of an infrared sensor of the present disclosure, at least one electrode selected from the lower electrode and the upper electrode has a line-and-space structure (L/S structure). An electrode having an L/S structure has a plurality of strips aligned in a specific alignment direction so as to be apart from one another. Thus, the main components of the infrared light transmitted through and reflected on the electrode having an L/S structure can be made to be polarized light having a vibration plane extending in the above alignment direction. This mitigates the aforementioned multiple reflections of infrared light and thus increases the amount of infrared light absorption by means of the above phase matching. Hence, the infrared sensor of the present disclosure can have a high light receiving sensitivity.

Embodiments of Present Disclosure

Hereinafter, embodiments of the present disclosure will be described with reference to the drawings. Note that the embodiments described below are all comprehensive or concrete examples. In the following embodiments, numerical values, shapes, materials, constituents, the arrangement positions and the ways of connections of the constituents, process conditions, steps, the order of steps, and the like are examples, which are not intended to limit the present disclosure. Of the constituents in the following embodiments, the constituents not stated in independent claims which express the highest concepts are described as optional constituents. In addition, each figure is a schematic diagram which is not necessarily illustrated precisely.

[Infrared Sensor]

Embodiment 1

Figure 1B:
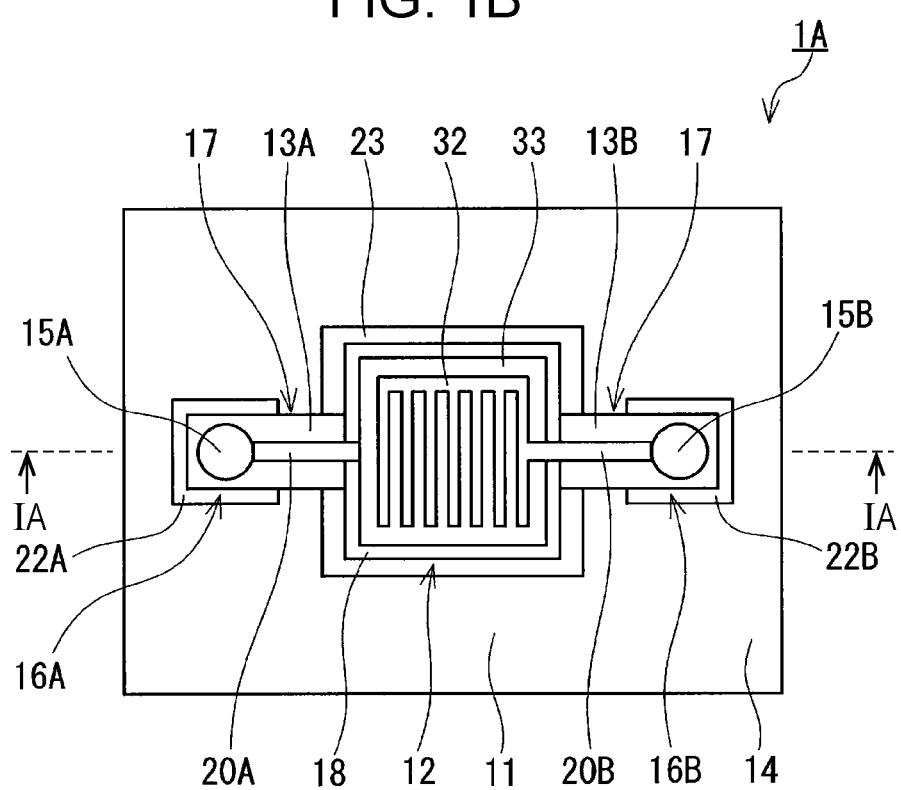
FIG. 1B is a schematic plan view of the infrared sensor of embodiment 1.

An infrared sensor of embodiment 1 is illustrated in FIGS. 1A and 1B. FIG. 1A illustrates a cross-sectional view of an infrared sensor 1A in FIG. 1B taken along line IA-IA. The infrared sensor 1A is a bolometer infrared sensor which is a type of a thermal infrared sensor. The infrared sensor 1A includes a base substrate 11, a bolometer infrared receiver 12, a first beam 13A, a second beam 13B, first wiring 20A, second wiring 20B, and an infrared reflection film 23. Each of the first beam 13A and the second beam 13B has a connection portion 16A or 16B connected to a member on the base substrate 11. Each of the first beam 13A and the second beam 13B has a separated portion 17 which is away from the base substrate 11. Each of the first beam 13A and the second beam 13B has the connection portion 16A or 16B at its one end. Each of the first beam 13A and the second beam 13B is physically joined to the infrared receiver 12 at its separated portion 17. The position at which each of the first beam 13A and the second beam 13B is physically joined to the infrared receiver 12 is its end on the other side. The infrared receiver 12 is supported by the first beam 13A and the second beam 13B so as to be away from the base substrate 11. This separation increases the degree of thermal insulation between the base substrate 11 and the infrared receiver 12.

The infrared sensor 1A further includes a first prop 15A and a second prop 15B that are members disposed on the base substrate 11 and extend in a direction away from an upper surface 14 of the base substrate 11. The first prop 15A and the second prop 15B are members on the base substrate 11. The first beam 13A is physically connected to the first prop 15A at the connection portion 16A. The second beam 13B is physically connected to the second prop 15B at the connection portion 16B. In cross-sectional view, the infrared receiver 12, the first beam 13A, and the second beam 13B are suspended by the first prop 15A and the second prop 15B over the base substrate 11. In the infrared sensor 1A illustrated in FIGS. 1A and 1B, the separation between the base substrate 11 and the infrared receiver 12 is achieved by means of the foregoing suspension by the first prop 15A and the second prop 15B.

The infrared receiver 12 includes a lower electrode 31, an upper electrode 32, and a resistance change film 33 including a resistance change material the electrical resistance of which changes with temperature. The resistance change film 33 is sandwiched by the lower electrode 31 and the upper electrode 32 in the thickness direction. The lower electrode 31 is directly joined to the resistance change film 33 electrically. The upper electrode 32 is directly joined to the resistance change film 33 electrically.

The first wiring 20A is formed on the first beam 13A. The first wiring 20A and the lower electrode 31 are electrically connected to each other. The first wiring 20A and the lower electrode 31 are integrated with each other. The second wiring 20B is formed on the second beam 13B. The second wiring 20B and the upper electrode 32 are electrically connected to each other. The second wiring 20B and the upper electrode 32 are integrated with each other.

The first prop 15A and the second prop 15B are electrically conductive. The first wiring 20A is electrically connected to the first prop 15A. The second wiring 20B is electrically connected to the second prop 15B. The first prop 15A and the second prop 15B have also a function of a path of the current for detecting the resistance of the resistance change film 33 included in the infrared receiver 12.

In the infrared sensor 1A, the resistance of the resistance change film 33 is read out. For the readout, the infrared sensor 1A illustrated in FIGS. 1A and 1B further includes a readout integrated circuit (ROIC) (not illustrated) inside the base substrate 11. The infrared sensor 1A further includes a first signal readout terminal 22A and a second signal readout terminal 22B on the upper surface 14 of the base substrate 11. The first prop 15A and the ROIC are electrically connected to each other via the first signal readout terminal 22A. The second prop 15B and the ROIC are electrically connected to each other via the second signal readout terminal 22B. The resistance of the resistance change film 33 can be read out via the lower electrode 31, the upper electrode 32, the first wiring 20A, the second wiring 20B, the first prop 15A, the second prop 15B, the first signal readout terminal 22A, and the second signal readout terminal 22B. Note that the electrical resistance between the first signal readout terminal 22A and the second signal readout terminal 22B between which the resistance change film 33 is positioned is the foregoing total electric resistance $R_{all}$. The infrared sensor 1A may further include members for reading out the resistance of the resistance change film 33.

When infrared light is incident on the infrared receiver 12, the temperature of the infrared receiver 12 increases. In this process, the more thermally insulated the infrared receiver 12 is from the base substrate 11, which serves as a heat bath, and the members on the base substrate 11, the more the temperature of the infrared receiver 12 increases. In the infrared sensor 1A including the bolometer infrared receiver 12, as the temperature increases, the resistance of the resistance change film 33 changes. An electrical signal corresponding to the changed resistance is processed in the ROIC, and thus the infrared light is detected. Depending on the processing, the intensity of infrared light and/or the temperature of the target object can be measured with the infrared sensor 1A. Here, as for the infrared sensor of the present disclosure, the way of reading out the resistance of the resistance change film 33 included in the infrared receiver 12 is not limited to methods using the ROIC provided inside the base substrate 11.

The infrared sensor 1A further includes the infrared reflection film 23 at a position on the surface of the base substrate 11 facing the infrared receiver 12. For the infrared sensor 1A illustrated in FIGS. 1A and 1B, the infrared reflection film 23 is disposed on the upper surface 14 of the base substrate 11. The infrared reflection film 23 reflects infrared light incident on the infrared sensor 1A from the outside. The reflected infrared light includes the infrared light having passed through the infrared receiver 12. The infrared light reflected on the infrared reflection film 23 can be incident on the infrared receiver 12 from the lower electrode 31 side. In plan view, the area of the infrared reflection film 23 is larger than that of the infrared receiver 12. In addition, in plan view, the infrared reflection film 23 is disposed to surround the infrared receiver 12. However, the concrete configuration of the infrared reflection film 23 is not limited to the example illustrated in FIGS. 1A and 1B. In this specification, the term "plan view" means viewing the target object from a direction perpendicular to the main face of the target object. Here, the term "main face" means the face having the largest area.

In the infrared sensor 1A illustrated in FIGS. 1A and 1B, both the lower electrode 31 and the upper electrode 32 have an L/S structure. The effective sheet resistances of the metal films included in the lower electrode 31 and the upper electrode 32 should desirably be larger than or equal to 100Ω/□ and smaller than or equal to 500Ω/□. In this case, the effective sheet resistances of the metal films are matched with the impedance of the vacuum. This reduces the infrared light reflection on the metal films and increases infrared light absorption. Here, the effective sheet resistance means the sheet resistance of a discontinuous object obtained based on effective medium approximation. This configuration can increase the degree of freedom of control for reducing the aforementioned multiple reflections of infrared light. In the infrared sensor 1A, the lower electrode 31 has a first L/S structure, and the upper electrode 32 has a second L/S structure. In plan view, the alignment direction of the first L/S structure and the alignment direction of the second L/S structure are different from each other. This configuration can further increase the degree of freedom of control for reducing the aforementioned multiple reflections of infrared light. In plan view, the angle formed by the alignment direction of the first L/S structure and the alignment direction of the second L/S structure, expressed by its minor angle, may be, for example, larger than or equal to 45 degrees, larger than or equal to 60 degrees, larger than or equal to 70 degrees, or larger than or equal to 80 degrees, or further, the angle may be larger than or equal to 85 degrees. The angle may also be larger than or equal to 80 degrees and smaller than or equal to 90 degrees. In the infrared sensor 1A, the alignment direction of the first L/S structure and the alignment direction of the second L/S structure are orthogonal to each other in plan view. In this specification, the term "orthogonal" means that two directions intersect with each other at an angle larger than or equal to 89 degrees and smaller than or equal to 90 degrees in expression of its minor angle, and the two directions may intersect at 90 degrees.

In an L/S structure, two or more strips are aligned in a specific alignment direction so as to be apart from one another. The line widths of the strips are in general equal to one another. In the case where an L/S structure has three or more strips, the intervals between adjoining strips are in general equal to one another. In an L/S structure, the line width and the interval may be equal.

The line width and the interval of the L/S structure that the lower electrode 31 and/or the upper electrode 32 can have may be smaller than or equal to 1 µm. The lower limit for the line width and the interval is, for example, larger than or equal to 30 nm. One-tenth of the center wavelength of the infrared light expected to be incident on the infrared sensor 1A corresponds to 1 µm. Thus, in the case where the line width and the interval of the L/S structure is smaller than or equal to 1 µm, it is possible to improve the infrared-light polarization selectivity of the lower electrode 31 and/or the upper electrode 32 having the L/S structure. Note that an L/S structure in which the line width and the interval are smaller than or equal to 1 µm may be taken as a wire grid structure for infrared light.

The first L/S structure that the lower electrode 31 can have and the second L/S structure that the upper electrode 32 can have may have the same line width and interval. This configuration can further increase the degree of freedom of control for reducing the aforementioned multiple reflections of infrared light. In the case where the first L/S structure and the second L/S structure have the same line width and interval and where the alignment direction of the first L/S structure and the alignment direction of the second L/S structure are orthogonal to each other in plan view, the degree of freedom can be particularly high.

Figure 2:
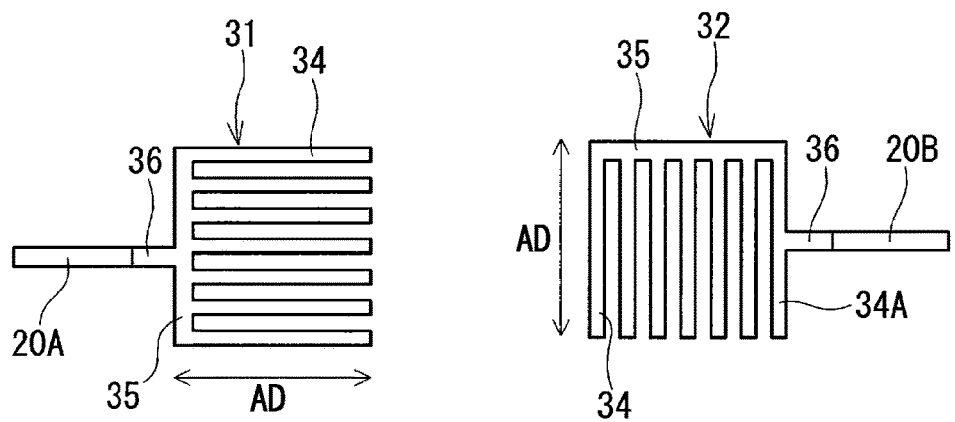
FIG. 2 is schematic plan views of a lower electrode and an upper electrode in the infrared sensor of embodiment 1.

The lower electrode 31 and the upper electrode 32 of the infrared sensor 1A illustrated in FIGS. 1A and 1B are illustrated in FIG. 2. Each of the lower electrode 31 and the upper electrode 32 in FIG. 2 has seven strips 34 extending in a specific one alignment direction AD. The seven strips 34 are physically and electrically connected to one another at their one ends with a bus line 35. For the lower electrode 31, a connection line 36 extends from the bus line 35 to be in parallel with the alignment direction AD on a side opposite from the side where the strips 34 are arranged. The connection line 36 is connected to the first wiring 20A formed in a strip shape, and the lower electrode 31 and the first wiring 20A are integrated with each other. The direction in which the first wiring 20A extends is in parallel with the alignment direction AD. For the upper electrode 32, the connection line 36 extends from a strip 34A positioned at an edge of the strip arrangement to be perpendicular to the alignment direction AD on a side opposite from the side where the strips 34 are arranged. The connection line 36 is connected to the second wiring 20B, and the upper electrode 32 and the second wiring 20B are integrated with each other. The direction in which the second wiring 20B extends is perpendicular to the alignment direction AD. The structure of the lower electrode 31 and the structure of the upper electrode 32 may be reversed. In other words, the lower electrode 31 may have the structure of the upper electrode 32 illustrated in FIG. 2, and the upper electrode 32 may have the structure of the lower electrode 31 illustrated in FIG. 2.

Figure 3A:
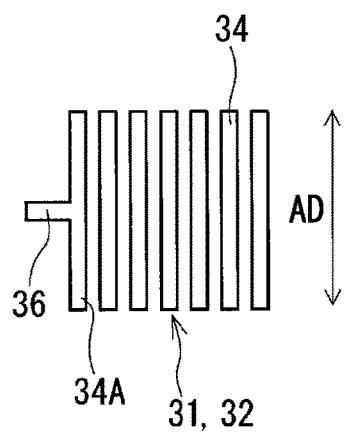
FIG. 3A is a schematic plan view of an example of a lower electrode and/or an upper electrode that the infrared sensor of the present disclosure can include.
Figure 3B:
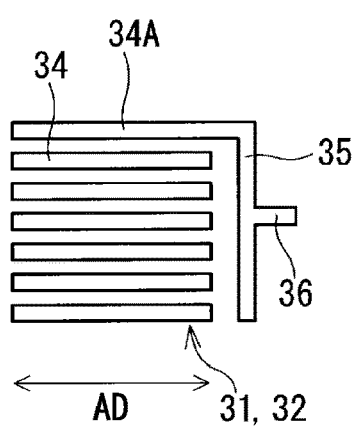
FIG. 3B is a schematic plan view of an example of a lower electrode and/or an upper electrode that the infrared sensor of the present disclosure can include.
Figure 3C:
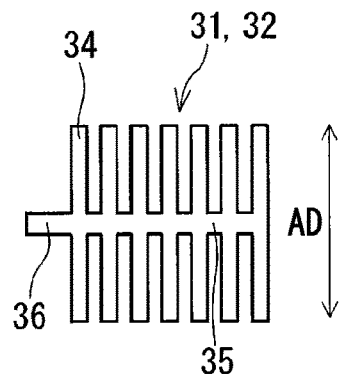
FIG. 3C is a schematic plan view of an example of a lower electrode and/or an upper electrode that the infrared sensor of the present disclosure can include.
Figure 3D:
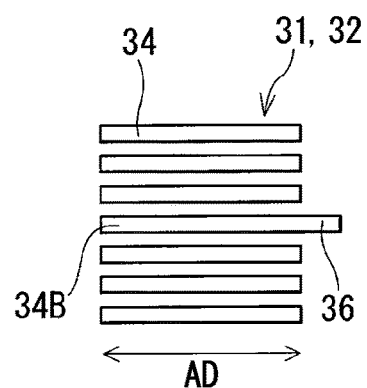
FIG. 3D is a schematic plan view of an example of a lower electrode and/or an upper electrode that the infrared sensor of the present disclosure can include.
Figure 3E:
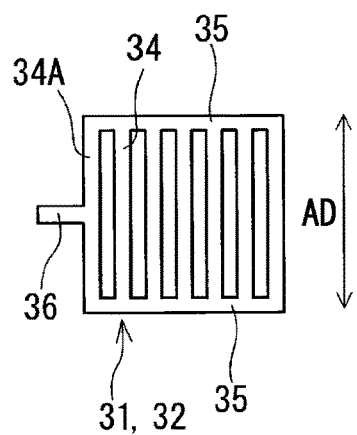
FIG. 3E is a schematic plan view of an example of a lower electrode and/or an upper electrode that the infrared sensor of the present disclosure can include.

Further examples of the lower electrode 31 and the upper electrode 32 are illustrated in FIGS. 3A, 3B, 3C, 3D, and 3E. The lower electrode 31 and/or the upper electrode 32 in FIGS. 3A, 3B, 3C, 3D, and 3E have/has seven strips 34 extending in a specific one alignment direction AD. For the lower electrode 31 and/or the upper electrode 32 in FIG. 3A, the strips 34 are neither physically nor electrically connected to one another. However, a connection line 36 extends from the strip 34A positioned at an edge of the strip arrangement to be perpendicular to the alignment direction AD on a side opposite from the side where the strips 34 are arranged. As illustrated in FIG. 3A, even in the case where the strips 34 are neither physically nor electrically connected to each other, the electrode having the L/S structure can have polarization selectivity for infrared light. The strip 34A electrically connected to the connection line 36 enables the electrode to function as an electrode for measuring the electrical resistance of the resistance change film 33. For the lower electrode 31 and/or the upper electrode 32 in FIG. 3B, the strips 34 are neither physically nor electrically connected to one another. However, a bus line 35 is connected to one end of the strip 34A positioned at an edge of the strip arrangement. In addition, a connection line 36 is disposed on a side opposite from the side where the strips 34 are arranged and connected to the bus line 35 to be in parallel with the alignment direction AD. In the lower electrode 31 and/or the upper electrode 32 in FIG. 3C, the strips 34 are electrically and physically connected to one another at their center by the bus line 35. One end of the bus line 35 serves as a connection line 36. For the lower electrode 31 and/or the upper electrode 32 in FIG. 3D, the strips 34 are neither physically nor electrically connected to one another. However, a connection line 36 is connected to one end of a strip 34B positioned at the center of the strip arrangement. For the lower electrode 31 and/or the upper electrode 32 in FIG. 3E, both ends of the strips 34 are physically and electrically connected to one another by bus lines 35. In addition, a connection line 36 extends from the strip 34A positioned at an edge of the strip arrangement to be perpendicular to the alignment direction AD on a side opposite from the side where the strips 34 are arranged.

The thicknesses of the lower electrode 31 and the upper electrode 32 are, for example, larger than or equal to 30 and smaller than or equal to 500 nm.

The lower electrode 31 and the upper electrode 32 that the infrared sensor of the present disclosure can have are not limited to the above examples.

In the infrared sensor 1A illustrated in FIGS. 1A and 1B, the infrared receiver 12 further includes a light-receiver supporting film 18. The light-receiver supporting film 18 is physically connected to the first beam 13A and the second beam 13B. The above suspension structure including the first beam 13A, the second beam 13B, the first prop 15A, and the second prop 15B is achieved by this connection. In the infrared sensor 1A, the light-receiver supporting film 18, the first beam 13A, and the second beam 13B are formed as one semiconductor layer 21. The semiconductor layer 21 includes a single layer. Here, the semiconductor layer 21 may have a stacked layer structure having two or more layers. In addition, the suspension structure of the infrared receiver 12 in the infrared sensor of the present disclosure using the first beam 13A, the second beam 13B, the first prop 15A, and the second prop 15B is not limited to the above example.

In the infrared sensor 1A, the area of the light-receiver supporting film 18 is larger than the area of the resistance change film 33 in plan view. In addition, in plan view, the light-receiver supporting film 18 is disposed to surround the resistance change film 33. Here, the concrete configuration of the light-receiver supporting film 18 is not limited to the example illustrated in FIGS. 1A and 1B.

The base substrate 11 typically includes a semiconductor. The semiconductor is, for example, silicon (Si). The upper surface 14 of the base substrate 11 including Si may have an oxide film on it. The oxide film is, for example, a $SiO_2$ film. However, the configuration of the base substrate 11 is not limited to the above example.

The ROIC may have a known configuration. The ROIC may be provided at a place different from the inside of the base substrate 11. The ROIC may be provided, for example, on the upper surface 14 of the base substrate 11.

The first prop 15A, the second prop 15B, the first signal readout terminal 22A, and the second signal readout terminal 22B include, for example, semiconductors in which impurities are doped or metals. Examples of the metals include ones having low thermal conductivity such as titanium (Ti) and titanium nitride (TiN). The metal may be aluminum (Al). However, the materials included in the first prop 15A, the second prop 15B, and the signal readout terminals 22A and 22B are not limited to the above examples.

The first beam 13A and the second beam 13B include, for example, a semiconductor or an oxide. Examples of the semiconductor include Si, silicon germanium (SiGe), and silicon nitride (SiN). Examples of the oxide include vanadium oxide. The first beam 13A and the second beam 13B may include Si or vanadium oxide. However, the materials included in the first beam 13A and the second beam 13B are not limited to the above examples.

The light-receiver supporting film 18 includes, for example, a semiconductor. Examples of the semiconductor include Si, SiGe, and SiN. The conductivity of the light-receiver supporting film 18 should desirably be low. For semiconductors having low electrical conductivities, an amorphous semiconductor may be selected. However, the material included in the light-receiver supporting film 18 is not limited to the above examples.

The lower electrode 31, the upper electrode 32, the first wiring 20A, and the second wiring 20B are electrically conductive. The lower electrode 31, the upper electrode 32, the first wiring 20A, and the second wiring 20B include, for example, semiconductors in which impurities are doped or metals. Examples of the metals include ones having low thermal conductivities such as Ti or TiN. However, the materials included in the lower electrode 31, the upper electrode 32, the first wiring 20A, and the second wiring 20B are not limited to the above examples.

The resistance change material included in the resistance change film 33 includes, for example, a semiconductor or an oxide. Examples of the semiconductor include Si and SiGe. Examples of the oxide include vanadium oxide. The resistance change film 33 may include Si or a vanadium oxide. The conductivity of the resistance change film 33 should desirably be low. For a semiconductor having low electrical conductivity, an amorphous semiconductor can be selected. The resistance change film 33 includes, for example, an amorphous Si. However, the resistance change material is not limited to the above examples.

The infrared reflection film 23 typically includes a metal. Examples of the metal include chromium (Cr), Al, and gold (Au). However, the material included in the infrared reflection film 23 is not limited to the above examples.

The section of the first beam 13A between the joint portion with the infrared receiver 12 and the connection portion 16A and/or the section of the second beam 13B between the joint portion with the infrared receiver 12 and the connection portion 16B may have a phononic crystal structure including a plurality of orderly arranged through holes. In the example of the infrared sensor 1A of embodiment 1, the section of the first beam 13A between the joint portion with the infrared receiver 12 and the connection portion 16A has a first phononic crystal structure having a plurality of orderly arranged through holes, and the section of the second beam 13B between the joint portion with the infrared receiver 12 and the connection portion 16B has a second phononic crystal structure having a plurality of orderly arranged through holes. The section is typically positioned at the separated portion 17 of the first beam 13A and/or the separated portion 17 of the second beam 13B.

In nonconductors and semiconductors, heat is mainly carried by lattice vibrations called phonons. The thermal conductivity of a material including a nonconductor or a semiconductor is determined by the dispersion relation of phonons that the material has. The dispersion relation of phonons means the relationship between the frequency and the number of waves or the band structure. In a nonconductor and a semiconductor, phonons that carry heat have frequencies in a wide frequency band from 100 GHz to 10 THz. This frequency band is a thermal band. The thermal conductivity of a material is determined by the dispersion relation of phonons in the thermal band.

For the phononic crystal structure, the dispersion relation of phonons that a material has can be controlled by the structure of the through-hole pitch. In other words, for the phononic crystal structure, the thermal conductivity itself of a material can be controlled. In particular, forming a phononic band gap (PBG) of the phononic crystal structure can greatly decrease the thermal conductivity of a material. There cannot be phonons in a PBG. Hence, a PBG positioned in the thermal band can be a gap of heat conduction. In addition, also in frequency bands other than the PBG, the slope of the phonon dispersion curve is decreased due to the PBG. The decrease in the slope reduces the group velocity of phonons and reduces the heat conduction speed. These points greatly contribute to the reduction of the thermal conductivity of the material. The thermal conductivity of a material can be reduced, for example, by porosification. This is because the pores formed by porosification reduce the thermal conductivity of the material. However, the phononic crystal structure can reduce the thermal conductivity of a material itself. Hence, it is expected that the thermal conductivity can be further reduced compared to the simple porosification.

As can be understood from the above explanation, the first beam 13A and the second beam 13B having a section having a phononic crystal structure can further decrease their thermal conductivities. Thus, in the case where the first beam 13A and/or the second beam 13B, in particular, both the first beam 13A and the second beam 13B, have a phononic crystal structure in the above sections, it is possible to further improve the thermal insulation between the base substrate 11 and the infrared receiver 12 in the infrared sensor 1A. The further improved thermal insulation makes it possible to improve the light receiving sensitivity of the infrared sensor 1A.

The following description concerns a phononic crystal structure that the first beam 13A and/or the second beam 13B can have. Hereinafter, the phononic crystal structure that the first beam 13A and/or the second beam 13B can have is referred to as a phononic crystal structure A.

Figure 4A:
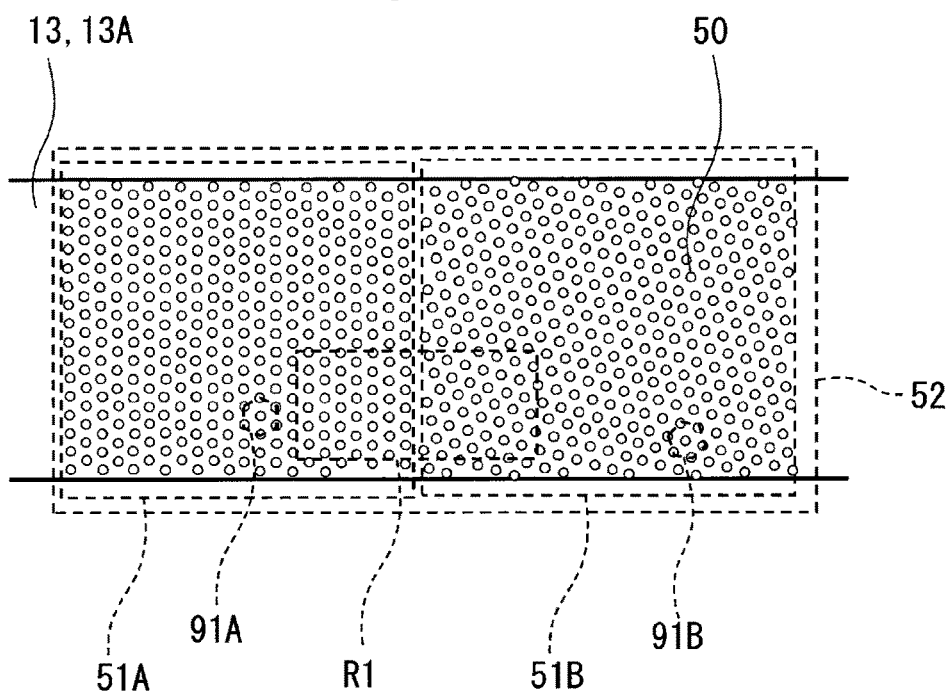
FIG. 4A is a schematic plan view of an example of a phononic crystal structure that a beam (first beam) of the infrared sensor of the present disclosure can have.
Figure 4B:
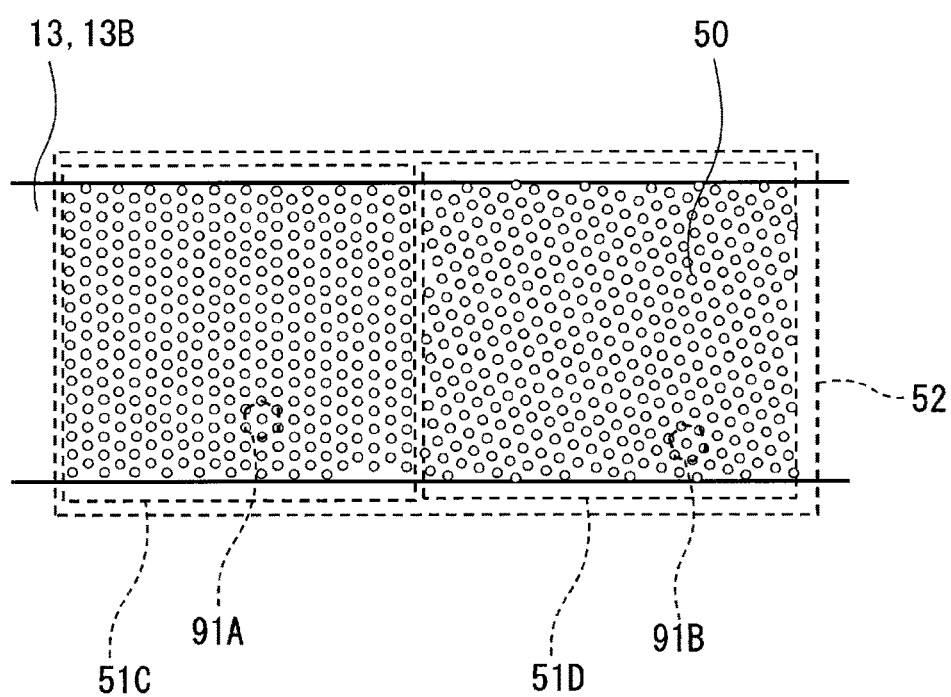
FIG. 4B is a schematic plan view of an example of a phononic crystal structure that a beam (second beam) of the infrared sensor of the present disclosure can have.

An example of the phononic crystal structure A is illustrated in FIGS. 4A and 4B. FIG. 4A illustrates part of the beam 13 (13A) in plan view. FIG. 4B illustrates part of the beam 13 (13B) in plan view. The beam 13 (13A, 13B) has a thickness, for example, larger than or equal to 10 nm and smaller than or equal to 500 nm. The beam 13 is rectangular in plan view. The long sides of the beam 13 are aligned with the direction of connecting the infrared receiver 12 and the connection portion 16A or 16B, in other words, the macroscopic heat transfer direction of the infrared sensor 1A. The beam 13 has a plurality of through holes 50 extending in the thickness direction of the beam 13. The phononic crystal structure A that the beam 13 has is a two-dimensional phononic crystal structure in which the through holes 50 are orderly arranged in the in-plane direction.

The phononic crystal structure A of the first beam 13A has a first domain 51A which is a phononic crystal region and a second domain 51B which is a phononic crystal region. The first domain 51A has a phononic single crystal structure having a plurality of through holes 50 orderly arranged in a first direction in plan view. The second domain 51B has a phononic single crystal structure having a plurality of through holes 50 orderly arranged in a second direction different from the first direction in plan view. In each single crystal structure, the diameters of the through holes 50 and their arrangement pitch are the same. In addition, in each single crystal structure, the orientations of the unit lattices 91A or 91B including a plurality of orderly arranged through holes 50 are the same. The shapes of the first domain 51A and the second domain 51B are rectangular in plan view. The shape of the first domain 51A and the shape of the second domain 51B are the same in plan view.

The phononic crystal structure A of the second beam 13B has a third domain 51C which is a phononic crystal region and a fourth domain 51D which is a phononic crystal region. The third domain 51C has a phononic single crystal structure having a plurality of through holes 50 orderly arranged in a third direction in plan view. The fourth domain 51D has a phononic single crystal structure having a plurality of through holes 50 orderly arranged in a fourth direction different from the third direction in plan view. In each single crystal structure, the diameters of the through holes 50 and their arrangement pitch are the same. In addition, in each single crystal structure, the orientations of the unit lattices 91A or 91B including a plurality of orderly arranged through holes 50 are the same. The shapes of the third domain 51C and the fourth domain 51D are rectangular in plan view. The shape of the third domain 51C and the shape of the fourth domain 51D are the same in plan view.

The phononic crystal structure A illustrated in FIGS. 4A and 4B is also a phononic polycrystalline structure 52 which is a composite of phononic single crystal structures.

The phononic crystal structure A illustrated in FIG. 4A and the phononic crystal structure A illustrated in FIG. 4B are the same. However, these structures may be different.

The phononic crystal structure A that the first beam 13A can have and the phononic crystal structure A that the second beam 13B can have may be the same or may be different from each other.

Hereinafter, description will be made of details of the configuration that the phononic crystal structure A can have, based on an example of the phononic crystal structure A that the first beam 13A can have, in other words, an example of the phononic crystal structure A that has the first domain 51A and the second domain 51B. The phononic crystal structure A that the second beam 13B can have may be of the same or a similar configuration. The phononic crystal structure A that the first beam 13A can have and the phononic crystal structure A that the second beam 13B can have may be different within the range of the configuration described below.

The domain of the phononic crystal region is a region, for example, having the area larger than or equal to $25P^2$ in plan view where P is the arrangement pitch of the through holes 50. To control the dispersion relation of phonons by means of the phononic crystal structure, a domain may have at least the area larger than or equal to $25P^2$. In the case of a square domain in plan view, the area larger than or equal to $25P^2$ can be achieved by setting it to 5×P (pitch) or more.

Figure 5A:
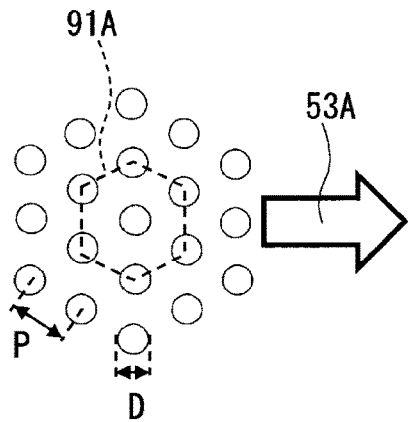
FIG. 5A is a schematic diagram illustrating a unit lattice and its orientation in a first domain included in the phononic crystal structure in FIG. 4A.
Figure 5B:
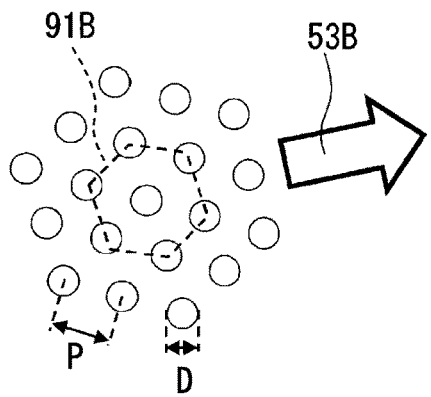
FIG. 5B is a schematic diagram illustrating a unit lattice and its orientation in a second domain included in the phononic crystal structure in FIG. 4A.

As illustrated in FIGS. 5A and 5B, in the phononic crystal structure A, an orientation 53A of the unit lattice 91A in the first domain 51A and an orientation 53B of the unit lattice 91B in the second domain 51B are different from each other in plan view. The angle formed by the orientation 53A and the orientation 53B is, for example, larger than or equal to 10 degrees in plan view. Here, in the case where the unit lattice 91A and the unit lattice 91B are the same and have n-fold rotational symmetry, the maximum angle formed by the orientation 53A and the orientation 53B is smaller than 360/n degrees. In the case where the unit lattice has n-fold rotational symmetry and n can take two or more numbers, the largest n is used to determine the above maximum angle. For example, a hexagonal lattice has two-fold rotational symmetry, three-fold rotational symmetry, and six-fold rotational symmetry. In this case, "6" is used as "n" to determine the maximum angle. Specifically, for the unit lattices 91A and 91B which are hexagonal lattices, the angle formed by the orientation 53A and the orientation 53B is smaller than 60 degrees. The phononic crystal structure A has at least two or more phononic crystal regions each having a different orientation of the unit lattice. As long as this condition is satisfied, the phononic crystal structure A may further include any phononic crystal region and/or a region not having a phononic crystal structure.

The orientation of the unit lattice can be determined based on an appropriate rule. However, the same rule needs to be applied for different domains to determine the orientations of the unit lattices. The orientation of the unit lattice is, for example, an extending direction of the straight line that bisects the angle formed by two sides of the unit lattice not in parallel with each other. In this case, the two sides need to be determined under the same rule between the different domains.

Figure 6:
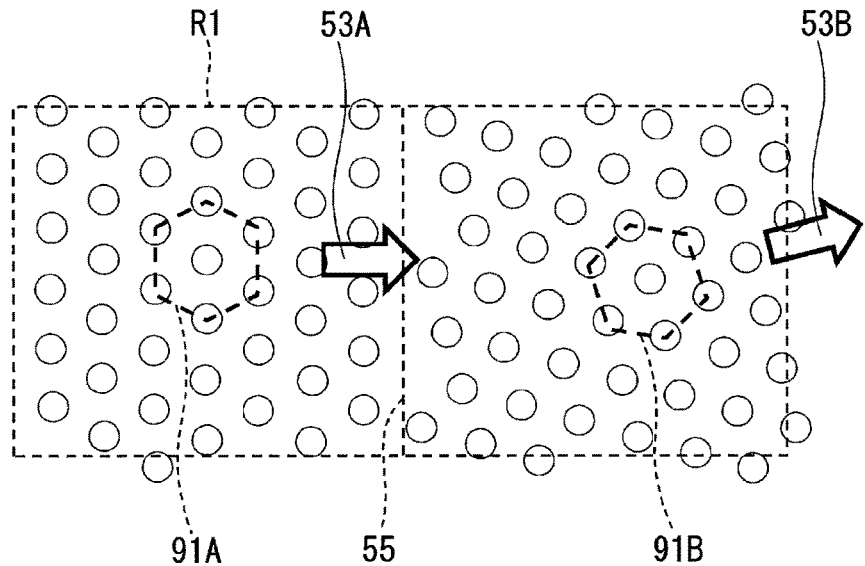
FIG. 6 is an enlarged view of a region in the phononic crystal structure in FIG. 4A.

FIG. 6 illustrates an enlarged view of a region R1 of the phononic crystal structure A in FIG. 4A. The orientations 53A and 53B of the unit lattices 91A and 91B are changed at the interface 55 between the adjoining first domain 51A and second domain 51B. The interface 55 at which the orientation of the unit lattice is changed provides a large interface resistance to the heat that flows through the phononic crystal structure A macroscopically. This interface resistance is based on a mismatch between the phonon group velocities of the first domain 51A and the second domain 51B. This interface resistance contributes to reduction of the thermal conductivity of the beam 13 (13A) having the phononic crystal structure A. In FIG. 6, the interface 55 extends in the form of a straight line in plan view. In addition, the interface 55 extends in the width direction of the rectangular beam 13 in plan view. The width direction can be a direction perpendicular to the extending direction of the center line of the beam 13 determined by the macroscopic heat transfer direction. The interface 55 divides the phononic crystal structure A in a direction perpendicular to the macroscopic heat transfer direction in plan view.

In the phononic crystal structure A in FIG. 4A, an arrangement pitch P of the through holes 50 in the first domain 51A and the arrangement pitch P of the through holes 50 in the second domain 51B are the same.

In the phononic crystal structure A in FIG. 4A, the diameter of the through holes 50 orderly arranged in the first domain 51A and the diameter of the through holes 50 orderly arranged in the second domain 51B are the same.

In the phononic crystal structure A in FIG. 4A, the type of the unit lattice 91A in the first domain 51A and the type of the unit lattice 91B in the second domain 51B are the same. The unit lattice 91A and the unit lattice 91B in FIG. 4A are both hexagonal lattices.

The shape of each domain in plan view is not limited to any specific ones. The shape of each domain in plan view is, for example, a polygon including a triangle, a square, and a rectangle, a circle, an ellipse, and a combination of these shapes. The shape of each domain in plan view may be an indeterminate shape. The number of domains that the phononic crystal structure A has is not limited to any specific ones. The more the number of domains that the phononic crystal structure A has, the larger the effect of the interface resistances of the interfaces between the domains. Further, the size of each domain that the phononic crystal structure A has is not limited to any specific ones.

Figure 7:
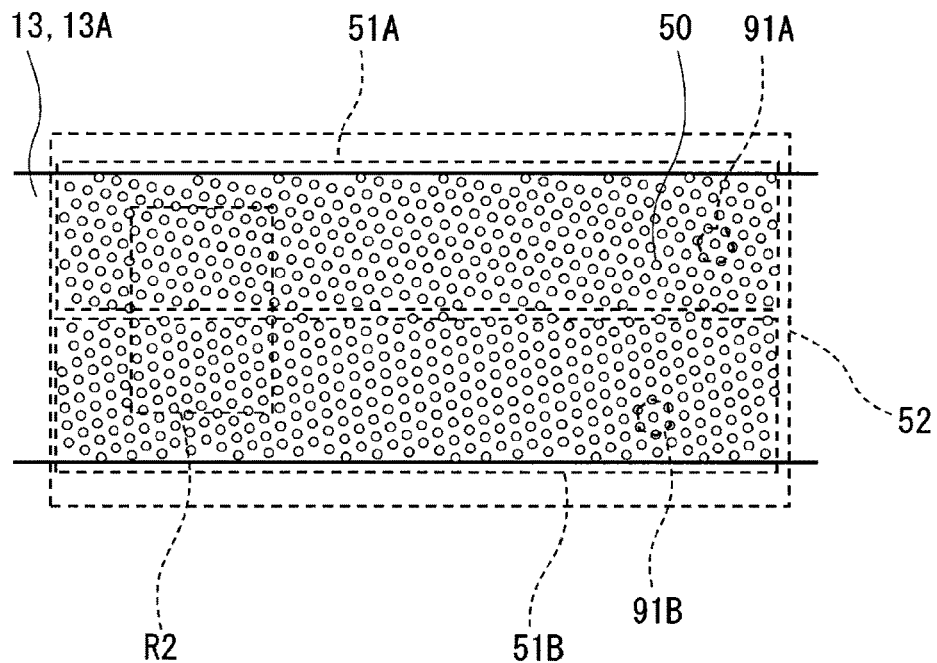
FIG. 7 is a schematic plan view of another example of a phononic crystal structure that the beam of the infrared sensor of the present disclosure can have.
Figure 8:
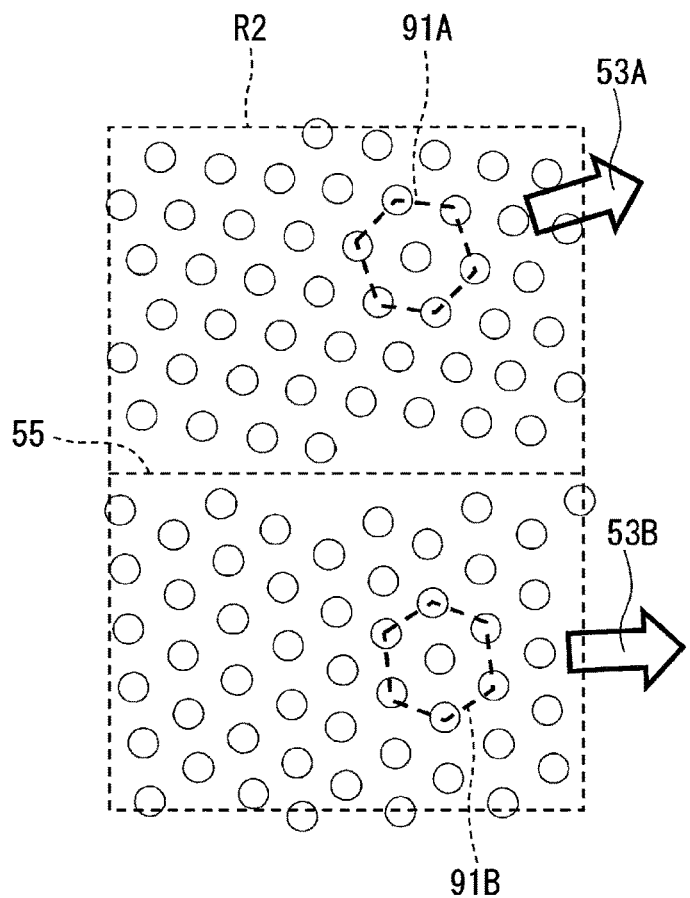
FIG. 8 is an enlarged view of a region in the phononic crystal structure in FIG. 7.

The phononic crystal structure A illustrated in FIGS. 7 and 8 is a polycrystalline structure 52. In the polycrystalline structure 52, the interface 55 between the adjoining first domain 51A and second domain 51B extends in the direction of the long sides of a rectangle beam 13 (13A) in plan view. The direction of the long sides can be the macroscopic heat transfer direction. Except for this point, the phononic crystal structure A in FIGS. 7 and 8 has a configuration the same as or similar to that of the phononic crystal structure A in FIG. 4A. The interface 55 divides the phononic crystal structure A in a direction in parallel with the macroscopic heat transfer direction in plan view. FIG. 8 is an enlarged view of a region R2 in FIG. 7.

In the phononic crystal structures A in FIGS. 4A and 7, the sizes of the first domain 51A and the second domain 51B are the same in plan view. However, the sizes of the first domain 51A and the second domain 51B that the phononic structure A has may be different from each other in plan view.

Figure 9:
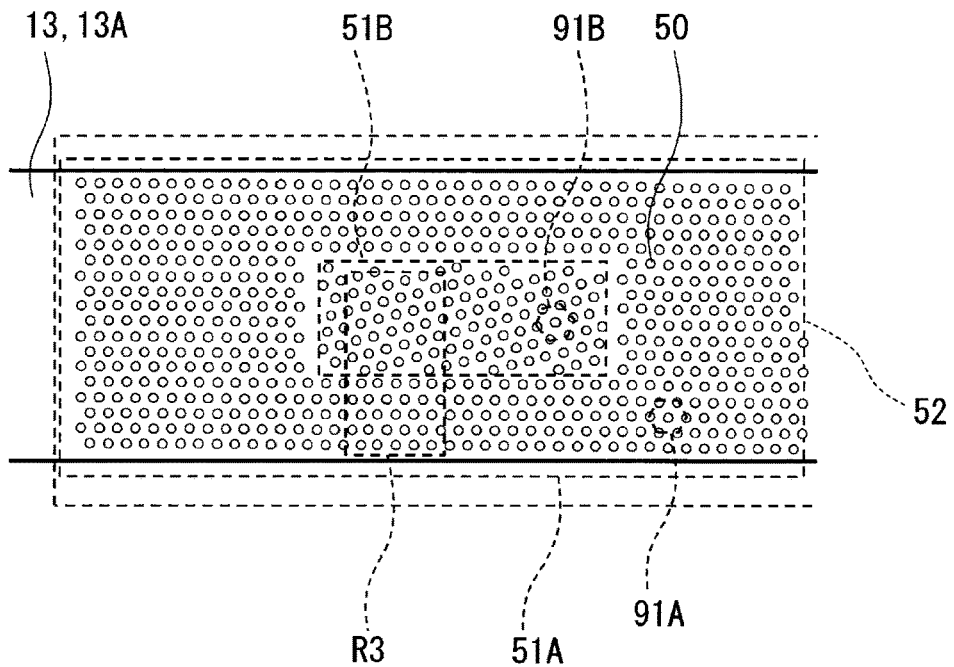
FIG. 9 is a schematic plan view of still another example of a phononic crystal structure that the beam of the infrared sensor of the present disclosure can have.
Figure 10:
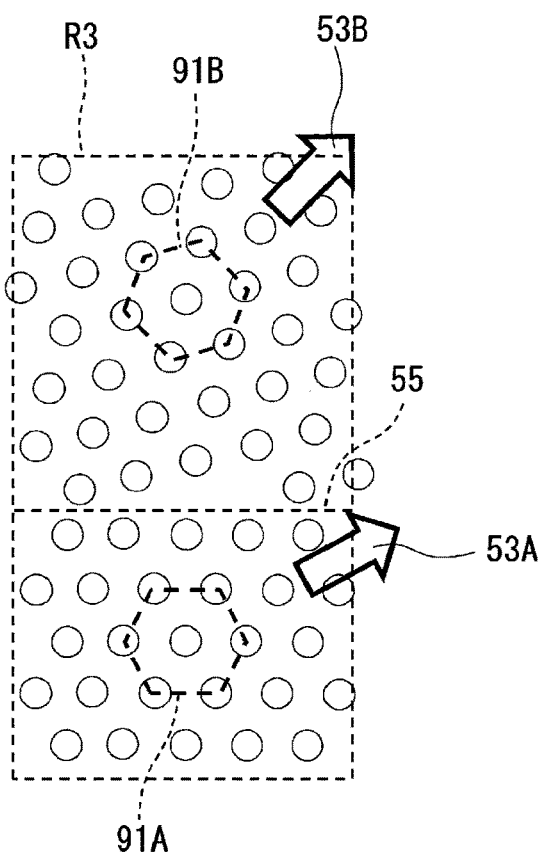
FIG. 10 is an enlarged view of a region in the phononic crystal structure in FIG. 9.

The phononic crystal structure A illustrated in FIGS. 9 and 10 is a polycrystalline structure 52. In the polycrystalline structure 52, the second domain 51B is surrounded by the first domain 51A in plan view. The shapes of the first domain 51A and the second domain 51B are rectangular in plan view. However, the size of the first domain 51A and the size of the second domain 51B are different in plan view. The interface 55 between the second domain 51B and the first domain 51A surrounding the second domain 51B forms the outer edges of the second domain 51B in plan view. Except for these points, the phononic crystal structure A in FIGS. 9 and 10 has a configuration the same as or similar to that of the phononic crystal structure A in FIG. 4A. FIG. 10 is an enlarged view of a region R3 in FIG. 9.

In the phononic crystal structure A in FIGS. 9 and 10, the interface 55 has corner portions.

In addition, the second domain 51B in the phononic crystal structure A in FIGS. 9 and 10 does not adjoin any side of the beam 13 (13A).

Figure 11:
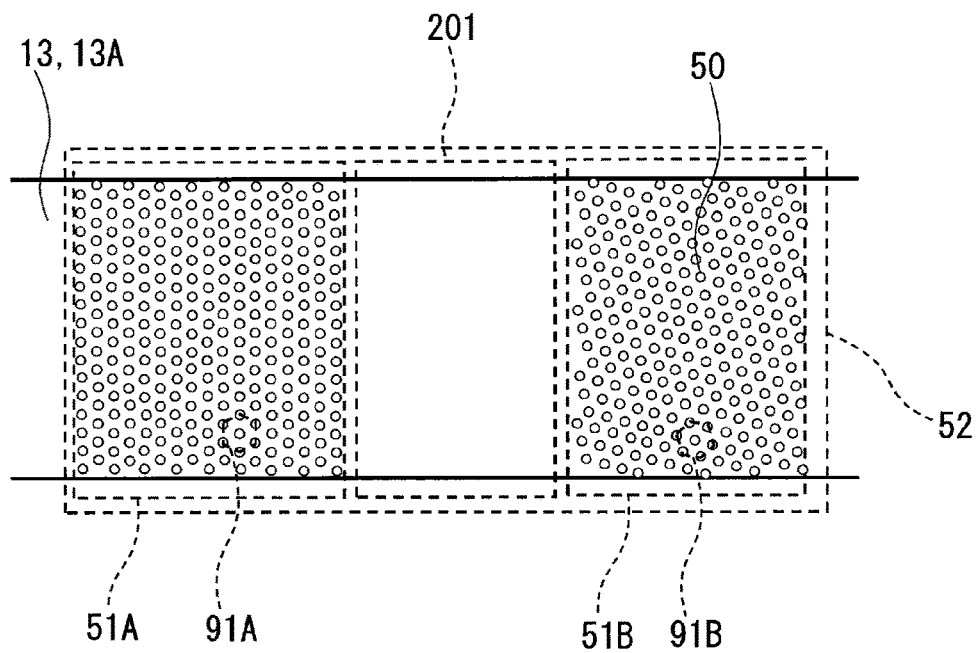
FIG. 11 is a schematic plan view of further still another example of a phononic crystal structure that the beam of the infrared sensor of the present disclosure can have.

The phononic crystal structure A illustrated in FIG. 11 is a polycrystalline structure 52. The polycrystalline structure 52 has a first domain 51A and a second domain 51B which are apart from each other in plan view. More specifically, the polycrystalline structure 52 has, in plan view, a region 201 having no through hole 50 between the first domain 51A and the second domain 51B in the long side direction of the beam 13 (13A). Except for this point, the phononic crystal structure A in FIG. 11 has a configuration the same as or similar to that of the phononic crystal structure A in FIG. 4A.

Figure 12:
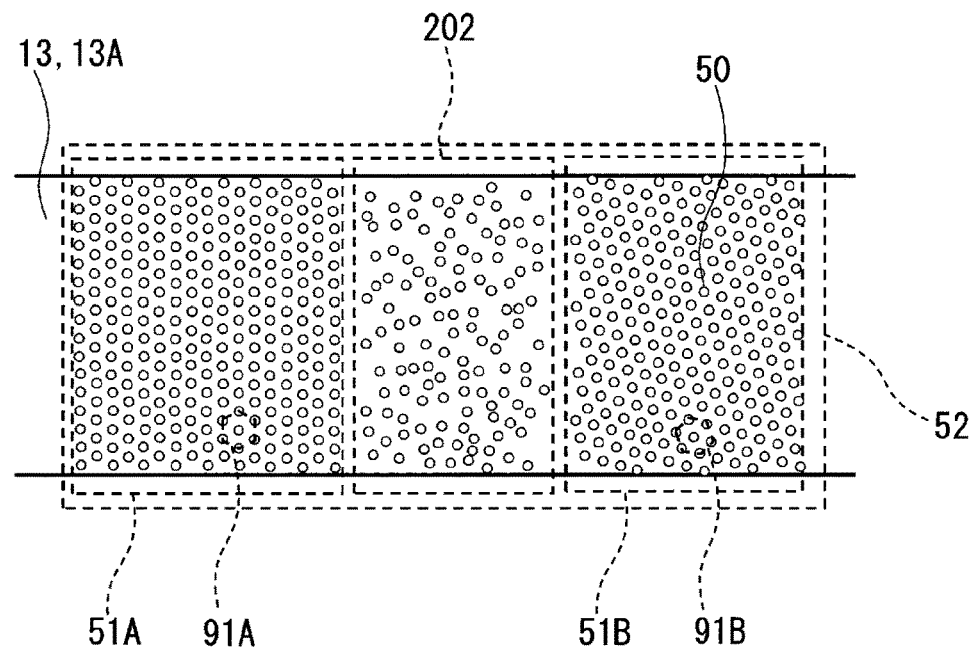
FIG. 12 is a schematic plan view of an example, which is different from the above examples, of a phononic crystal structure that the beam of the infrared sensor of the present disclosure can have.

The phononic crystal structure A illustrated in FIG. 12 is a polycrystalline structure 52. The polycrystalline structure 52 has a first domain 51A and a second domain 51B which are apart from each other in plan view. More specifically, the polycrystalline structure 52 has, in plan view, a region 202 having randomly arranged through holes 50 between the first domain 51A and the second domain 51B in the long side direction of the beam 13 (13A). In the region 202, the through holes 50 are not orderly arranged in plan view. Alternatively, in the region 202, the area of a region where through holes are orderly arranged is, for example, smaller than $25P^2$ in plan view. Here, P is the arrangement pitch of the through holes 50. Except for this point, the phononic crystal structure A in FIG. 12 has a configuration the same as or similar to that of the phononic crystal structure A in FIG. 4A.

Figure 13:
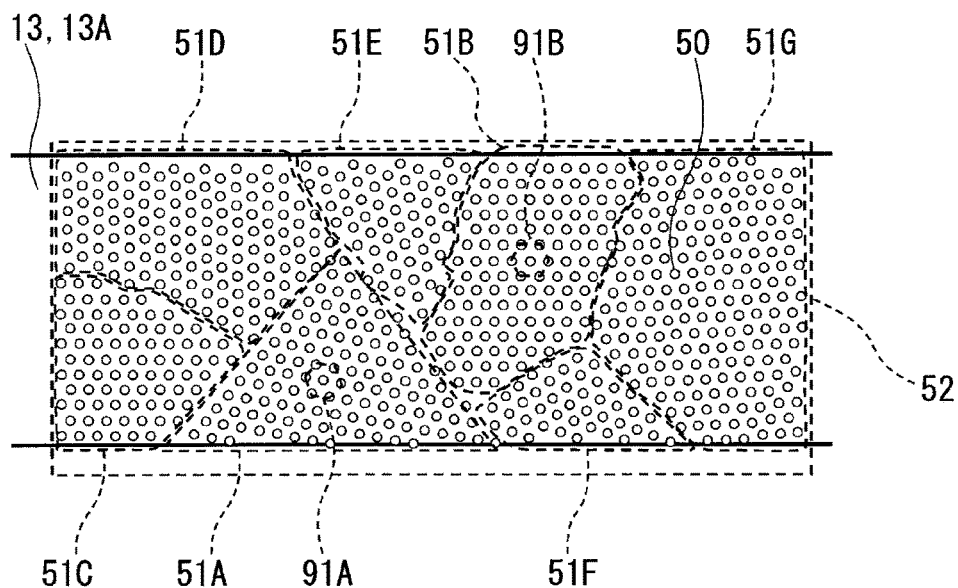
FIG. 13 is a schematic plan view of an example, which is different from the above examples, of a phononic crystal structure that the beam of the infrared sensor of the present disclosure can have.

The phononic crystal structure A illustrated in FIG. 13 is a polycrystalline structure 52. The polycrystalline structure 52 includes a plurality of domains 51A, 51B, 51C, 51D, 51E, 51F, and 51G each having a different shape in plan view. Within each domain, the arrangement pitch of the through holes 50 and the orientation of each unit lattice are the same. However, the orientation of the unit lattices in each of the domains 51A to 51G is different from one another. The size and shape of each of the domains 51A to 51G are different from one another in plan view. This configuration has a larger number of kinds in the orientation of the unit lattice as the whole of the phononic crystal structure A than the other configurations that have been described up to this point. Thus, the effect to reduce the thermal conductivity on the basis of the difference in the orientation of the unit lattice between domains is greater. Also, in this configuration, the interfaces 55 between the domains extend in plural random directions in plan view. This configuration makes the effect to reduce the thermal conductivity on the basis of the interface resistance greater.

In the phononic crystal structure A in FIG. 13, the interface 55 between the adjoining first domain 51A and second domain 51B extends in a direction inclined from the width direction of the beam 13 (13A) in plan view. The interfaces 55 also have corner portions in plan view.

Figure 14A:
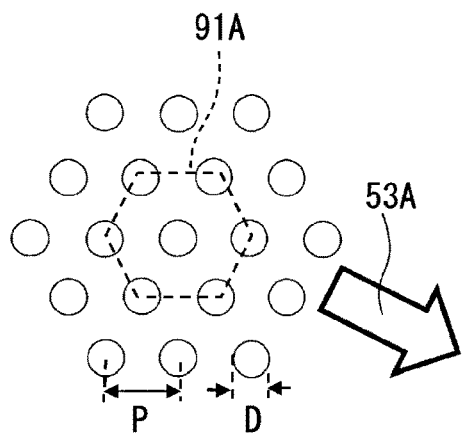
FIG. 14A is a schematic diagram illustrating an example of a unit lattice of the phononic crystal structure that the beam of the infrared sensor of the present disclosure can have.
Figure 14B:
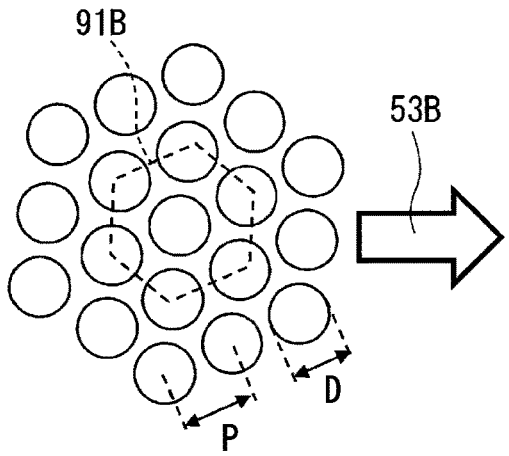
FIG. 14B is a schematic diagram illustrating another example of a unit lattice of the phononic crystal structure that the beam of the infrared sensor of the present disclosure can have.

The polycrystalline structure 52 which is the phononic crystal structure A may include the first domain 51A and the second domain 51B each having a different arrangement pitch P of the through holes 50 and/or a different diameter D of the through holes 50. The diameter D of the through holes 50 in the first domain 51A illustrated in FIG. 14A and the diameter D of the through holes 50 in the second domain 51B illustrated in FIG. 14B are different from each other. The arrangement pitch P of the through holes 50 in the first domain 51A illustrated in FIG. 14A and the arrangement pitch P of the through holes 50 in the second domain 51B illustrated in FIG. 14B are the same.

Figure 15:
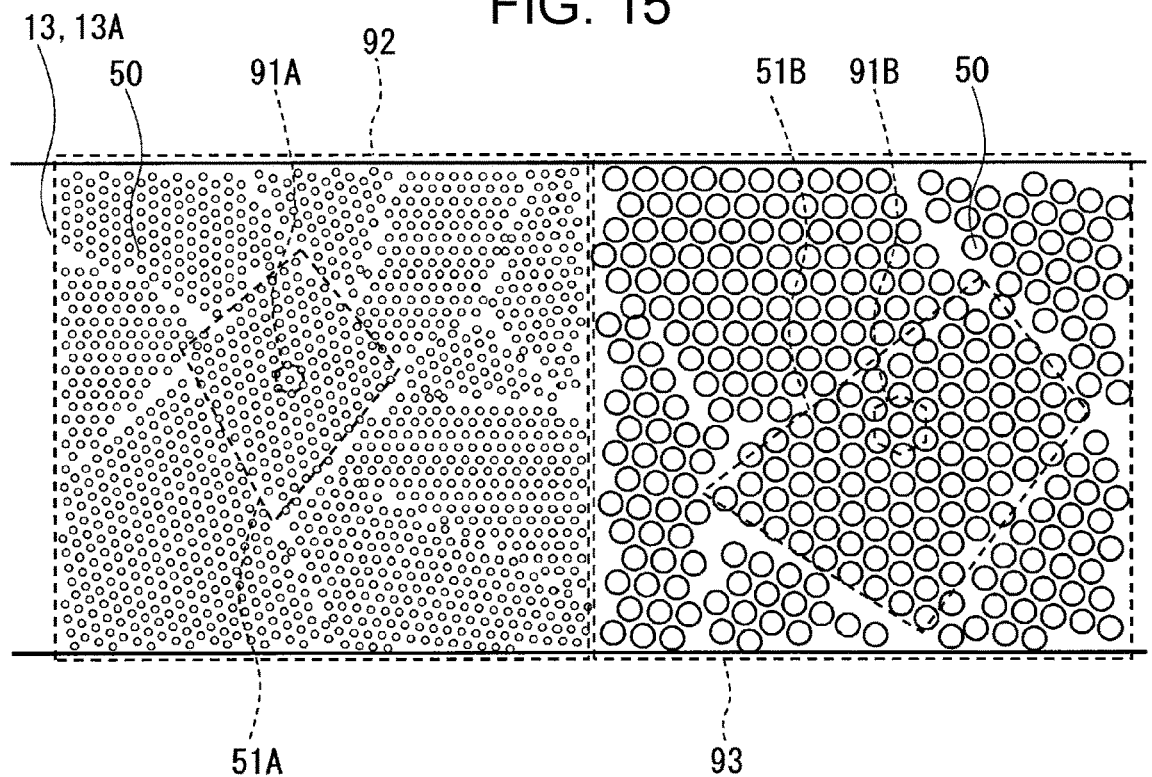
FIG. 15 is a schematic plan view of an example, which is different from the above examples, of a phononic crystal structure that the beam of the infrared sensor of the present disclosure can have.

The phononic crystal structure A illustrated in FIG. 15 has a first domain 51A in which a plurality of through holes 50 having a relatively small pitch P and diameter D are orderly arranged and a second domain 51B in which a plurality of through holes 50 having a relatively large pitch P and diameter D are orderly arranged. The phononic crystal structure A in FIG. 15 has a region 92 including a plurality of through holes 50 having a relatively small pitch P and diameter D and a region 93 including a plurality of through holes 50 having a relatively large pitch P and diameter D. The region 92 and the region 93 adjoin each other. The region 92 and the region 93, as in the example of FIG. 13, each include a plurality of domains each having a different shape and a different orientation of unit lattices in plan view. The region 92 and the region 93 are obtained by dividing the phononic crystal structure A in a direction perpendicular to the macroscopic heat transfer direction. In this configuration, the frequency band of the phononic band gap formed in the first domain 51A and the frequency band of the phononic band gap formed in the second domain 51B are different, and thus the effect to reduce thermal conductivity is particularly large.

Figure 16:
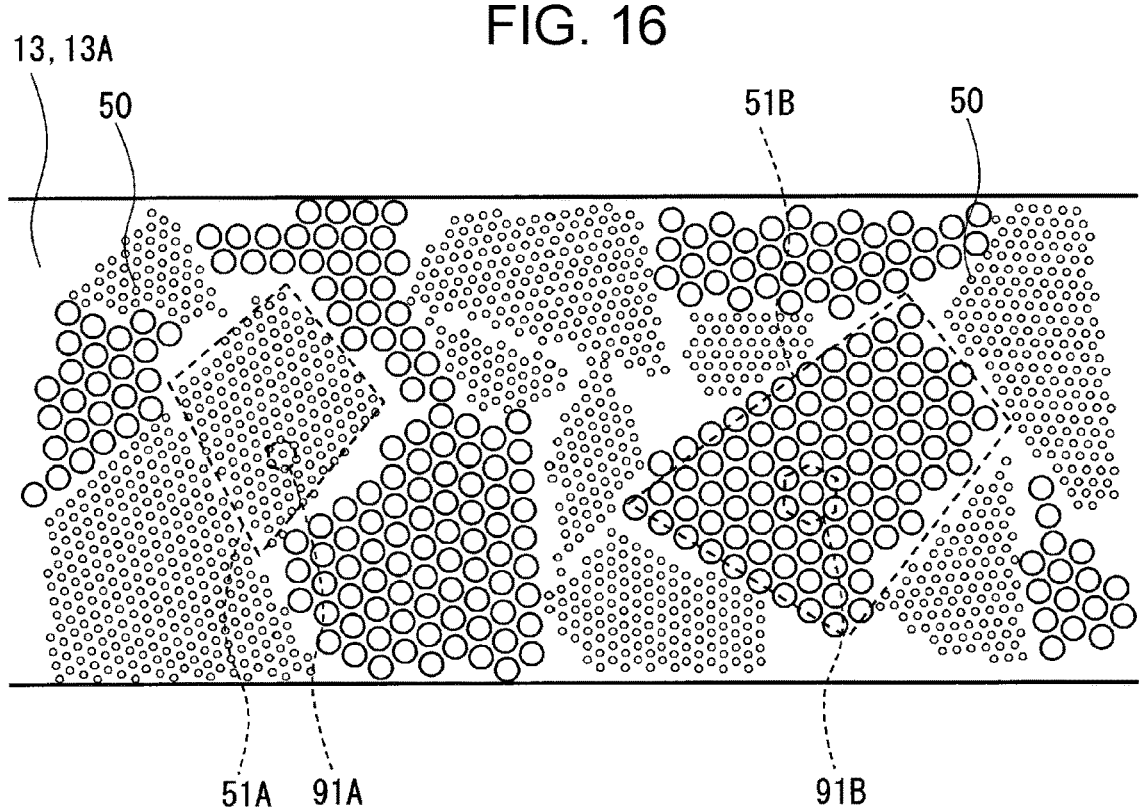
FIG. 16 is a schematic plan view of an example, which is different from the above examples, of a phononic crystal structure that the beam of the infrared sensor of the present disclosure can have.

The phononic crystal structure A illustrated in FIG. 16 has a first domain 51A in which a plurality of through holes 50 having a relatively small interval P and diameter D are orderly arranged and a second domain 51B in which a plurality of through holes 50 having a relatively large interval P and diameter D are orderly arranged. The phononic crystal structure A in FIG. 16 has a plurality of domains each having a different shape and a different orientation of unit lattices in plan view. In this configuration, the frequency band of the phononic band gap formed in the first domain 51A and the frequency band of the phononic band gap formed in the second domain 51B are different, and thus the effect to reduce thermal conductivity is particularly large.

The arrangement pitch P of the through holes 50 is, for example, larger than or equal to 1 nm and smaller than or equal to 300 nm. This is because the wavelengths of phonons which carry heat range from 1 nm to 300 nm. The pitch P is determined by the distance between the centers of adjoining through holes 50 in plan view (see FIGS. 14A and 14B).

The diameter D of the through holes 50 can be expressed by D/P, which the ratio relative to the pitch P, and is, for example, D/P≥0.5. In the case where the ratio D/P<0.5, the porosity in the beam 13 (13A, 13B) is excessively low, and thus the thermal conductivity may not be sufficiently low. The upper limit of the ratio D/P is, for example, smaller than 0.9 so that adjoining through holes 50 will not be in contact with one another. The diameter D means the diameter of the opening of the through hole 50. In the case where the shape of the opening of the through hole 50 is a circle in plan view, the diameter D is the diameter of the circle. The shape of the opening of the through hole 50 does not have to be a circle in plan view. In this case, the diameter D is determined by the diameter of the imaginary circle having the same area as the opening (see FIGS. 14A and 14B).

Figure 17A:
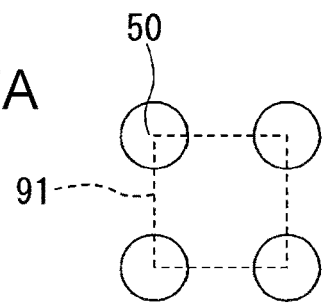
FIG. 17A is a schematic diagram illustrating an example of a unit lattice of the phononic crystal structure that the beam of the infrared sensor of the present disclosure can have.
Figure 17B:
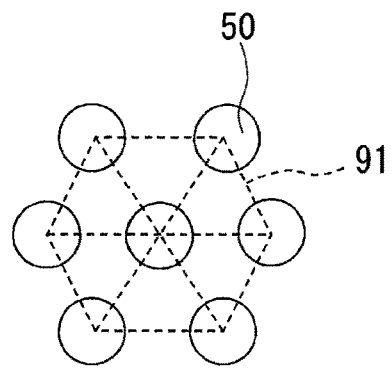
FIG. 17B is a schematic diagram illustrating another example of a unit lattice of the phononic crystal structure that the beam of the infrared sensor of the present disclosure can have.
Figure 17C:
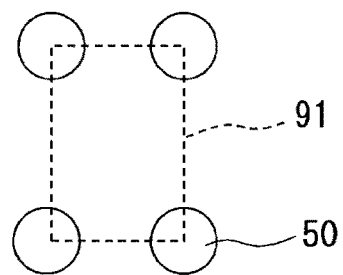
FIG. 17C is a schematic diagram illustrating still another example of a unit lattice of the phononic crystal structure that the beam of the infrared sensor of the present disclosure can have.
Figure 17D:
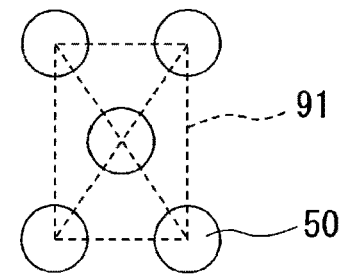
FIG. 17D is a schematic diagram illustrating an example, which is different from the above examples, of a unit lattice of the phononic crystal structure that the beam of the infrared sensor of the present disclosure can have.

Examples of the type of the unit lattice 91 including a plurality of orderly arranged through holes 50 include a square lattice (FIG. 17A), a hexagonal lattice (FIG. 17B), a rectangular lattice (FIG. 17C), and a centered rectangular lattice (FIG. 17D). However, the type of the unit lattice 91 is not limited to these examples.

The phononic crystal structure A that the first beam 13A and/or the second beam 13B can have is not limited to the foregoing structures. The phononic crystal structure A may be, for example, the structure disclosed in Japanese Unexamined Patent Application Publication No. 2017-223644. However, the phononic crystal structure A having two or more phononic crystal regions each having a different orientation of unit lattices, illustrated in the foregoing figures such as FIGS. 4A and 4B, enables a further reduction of the thermal conductivity of the beam 13, in other words, a further improvement in the heat insulation property. The reasons are as follows.

According to the study by the inventors, the degree of the reduction of thermal conductivity achieved by a phononic crystal structure is dependent on the angle formed by the heat transfer direction and the orientation of the unit lattices in the phononic crystal structure. The reason is probably that the factors related to heat conduction, such as the bandwidth of the PBG, the number of PBGs, and the average group velocity of phonons, are dependent on the angle. As for heat transfer, phonons flow macroscopically in a direction from a high temperature part toward a low temperature part. However, when focusing attention on micro regions on the order of nanometers, no directivity can be seen in the directions of phonon flows. In other words, the directions of phonon flows are not uniform microscopically. In the phononic crystal structure A having a plurality of phononic crystal regions in which the orientations of the unit lattices are uniformly aligned between the regions, the interactions are largest for phonons that flow in a specific direction, but the interaction is small for phonons that flow in other directions, from a microscopic point of view. However, in the phononic crystal structure A having two or more phononic crystal regions in which the orientations of the unit lattices are different between the regions, the interactions can be increased for phonons flowing different directions, from a microscopic point of view. This enables a further reduction of the thermal conductivity of the beam 13.

Embodiment 2

Figure 18A:
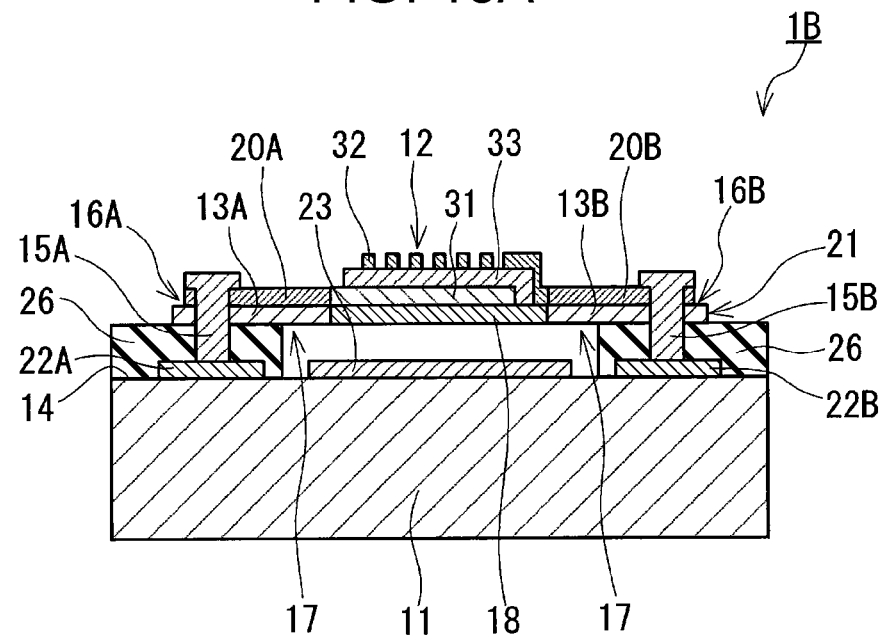
FIG. 18A is a schematic cross-sectional view of an infrared sensor of embodiment 2.
Figure 18B:
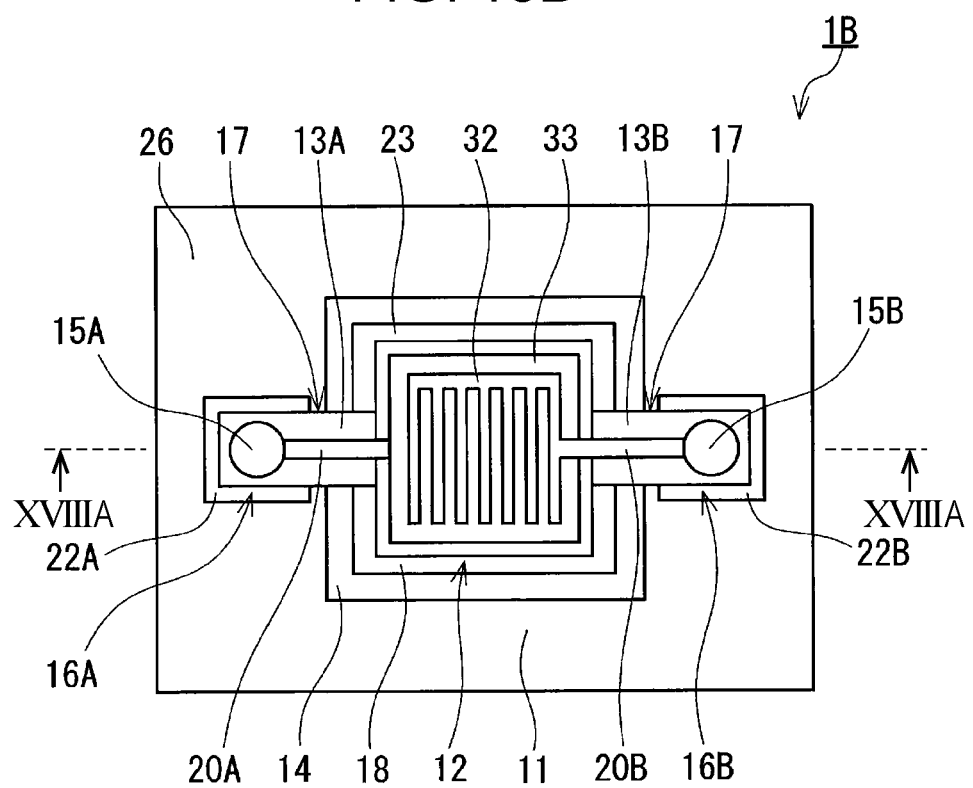
FIG. 18B is a schematic plan view of the infrared sensor of embodiment 2.

An infrared sensor of embodiment 2 is illustrated in FIGS. 18A and 18B. FIG. 18A illustrates a cross-sectional view of an infrared sensor 1B taken along line XVIIIA-XVIIIA in FIG. 18B. The infrared sensor 1B is a bolometer infrared sensor which is a type of a thermal infrared sensor.

The infrared sensor 1B further includes an insulation layer 26 on the base substrate 11. In cross-sectional view, the insulation layer 26 is disposed between the upper surface 14 of the base substrate 11 and the first and second beams 13A and 13B (the semiconductor layer 21). The insulation layer 26 is disposed to surround the infrared receiver 12 and the infrared reflection film 23 in plan view. In addition, the section of the first prop 15A between the signal readout terminal 22A and the first beam 13A is surrounded by the insulation layer 26. The section of the second prop 15B between the signal readout terminal 22B and the second beam 13B is surrounded by the insulation layer 26.

The material included in the insulation layer 26 is, for example, an oxide such as $SiO_2$. However, the material included in the insulation layer 26 is not limited to the above example.

The other configurations of the infrared sensor 1B of embodiment 2 are the same as or similar to the corresponding configurations of the infrared sensor 1A of embodiment 1, including the preferred embodiments. The operating principle of the infrared sensor 1B of embodiment 2 is the same as that of the infrared sensor 1A of embodiment 1.

Embodiment 3

Figure 19:
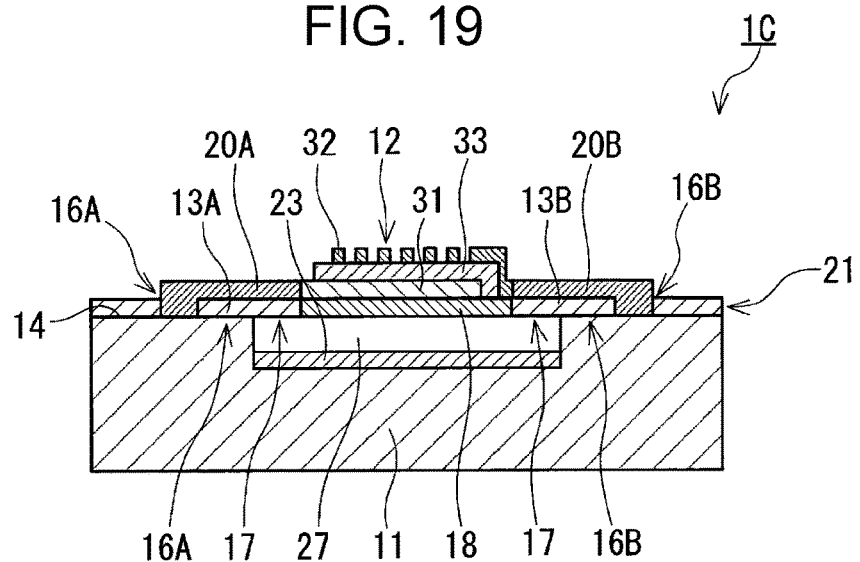
FIG. 19 is a schematic cross-sectional view of an infrared sensor of embodiment 3.

An infrared sensor of embodiment 3 is illustrated in FIG. 19. An infrared sensor 1C illustrated in FIG. 19 is a bolometer infrared sensor which is a type of a thermal infrared sensor. The infrared sensor 1C includes a base substrate 11, a bolometer infrared receiver 12, a first beam 13A, a second beam 13B, first wiring 20A, second wiring 20B, and an infrared reflection film 23. Each of the first beam 13A and the second beam 13B has the connection portion 16A or 16B connected to the base substrate 11. Each of the first beam 13A and the second beam 13B has a separated portion 17 which is away from the base substrate 11. Each of the first beam 13A and the second beam 13B has the connection portion 16A or 16B at its one end. Each of the first beam 13A and the second beam 13B is physically joined to the infrared receiver 12 at its separated portion 17. The position at which each of the first beam 13A and the second beam 13B is physically joined to the infrared receiver 12 is its other end. The infrared receiver 12 is supported by the first beam 13A and the second beam 13B so as to be away from the base substrate 11. This separation increases the degree of thermal insulation between the base substrate 11 and the infrared receiver 12.

The base substrate 11 has a recess 27 in the upper surface 14 on which the infrared receiver 12 is provided. In plan view, the area of the recess 27 is larger than that of the infrared receiver 12. The infrared receiver 12 is surrounded by the outer edges of the recess 27 in plan view. The recess 27 is positioned between the base substrate 11 and the infrared receiver 12, the separated portion 17 of the first beam 13A, and the separated portion 17 of the second beam 13B. The first beam 13A is physically connected to the base substrate 11 at the connection portion 16A. The second beam 13B is physically connected to the base substrate 11 at the connection portion 16B. In cross-sectional view, the infrared receiver 12, the separated portion 17 of the first beam 13A, and the separated portion 17 of the second beam 13B are suspended over the recess 27 of the base substrate 11. This suspension increases the degree of thermal insulation between the base substrate 11 and the infrared receiver 12.

In the infrared sensor 1C, the resistance of the resistance change film 33 is read out. For the readout, the infrared sensor 1C illustrated in FIG. 19 further includes a ROIC (not illustrated) inside the base substrate 11. An end of the first wiring 20A is electrically connected to the ROIC. An end of the second wiring 20B is electrically connected to the ROIC. The resistance of the resistance change film 33 can be read out via the lower electrode 31, the upper electrode 32, the first wiring 20A, and the second wiring 20B. The infrared sensor 1C may further include members for reading out the resistance of the resistance change film 33.

When infrared light is incident on the infrared receiver 12, the temperature of the infrared receiver 12 increases. In this process, the more thermally insulated the infrared receiver 12 is from the base substrate 11, which serves as a heat bath, the more the temperature of the infrared receiver 12 increases. In the infrared sensor 1C including the bolometer infrared receiver 12, as the temperature increases, the resistance of the resistance change film 33 changes. An electrical signal corresponding to the changed resistance is processed in the ROIC, and thus the infrared light is detected. Depending on the processing, the intensity of infrared light and/or the temperature of the target object can be measured with the infrared sensor 1C. Here, as for the infrared sensor of the present disclosure, the way of reading out the resistance of the resistance change film 33 included in the infrared receiver 12 is not limited to methods using the ROIC provided inside the base substrate 11, as described earlier.

The infrared sensor 1A of embodiment 1 and the infrared sensor 1C of embodiment 3 are different in the way of suspending the infrared receiver 12, the first beam 13A, and the second beam 13B over the upper surface 14 of the base substrate 11. In the infrared sensor 1C of embodiment 3, the infrared reflection film 23 is disposed on the bottom surface of the recess 27. However, the infrared sensor 1C has the same configuration as the infrared sensor 1A in that the infrared reflection film 23 is disposed at a position on the surface of the base substrate 11 facing the infrared receiver 12. The other configurations of the infrared sensor 1C of embodiment 3 are the same as or similar to the corresponding configurations of the infrared sensor 1A of embodiment 1, including the preferred embodiments.

The infrared sensor of the present disclosure may have any member other than the foregoing members as long as the configuration provides the effect of the present disclosure.

[Infrared Sensor Array]

The infrared sensors 1A to 1C of embodiments 1 to 3 function independently as an infrared sensor in principle. An infrared sensor may be used as a pixel, and a plurality of infrared sensors may be arranged in an array on the base substrate 11. The arrangement is typically in the form of a two-dimensional array. An array structure in which a plurality of infrared sensors are arranged enables, for example, imaging of an object having a finite temperature and/or evaluation of the strength distribution of infrared light radiation or a laser beam. Here, at least some of the infrared sensors arranged in an array are infrared sensors of the present disclosure. All of the infrared sensors arranged in an array may be infrared sensors of the present disclosure. The present disclosure includes a sensor array that includes an infrared sensor array having a plurality of infrared sensors arranged in a two-dimensional array, the infrared sensors including an infrared sensor of the present disclosure.

[Method of Manufacturing Infrared Sensor]

The infrared sensor of the present disclosure can be manufactured by a combination of various thin-film forming methods, such as chemical vapor deposition (CVD), sputtering, and vapor deposition, and various microfabrication methods and pattern forming methods, such as electron beam lithography, photolithography, block copolymer lithography, and selective etching. The block copolymer lithography is suitable for forming the phononic crystal structure A.

Hereinafter, an example of the method of manufacturing the infrared sensor of the present disclosure will be described below with reference to FIGS. 20A to 22O. The infrared sensor manufactured in the following method is the infrared sensor 1A of embodiment 1. Here, in the infrared sensor 1A manufactured in the following method, the first beam 13A and the second beam 13B have the phononic crystal structure A. The method of manufacturing the infrared sensor of the present disclosure is not limited to the following example.

Figure 20A:
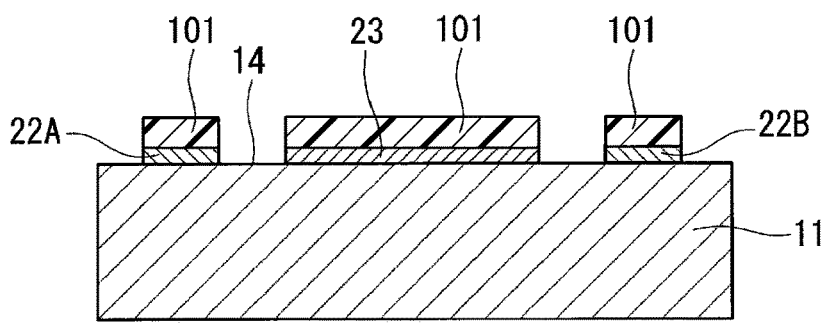
FIG. 20A is a schematic cross-sectional diagram for explaining an example of a method of manufacturing an infrared sensor of the present disclosure.

FIG. 20A: A base substrate 11 is prepared. Next, a metal layer is formed on the upper surface 14 of the base substrate 11. The metal layer is, for example, a Cr layer. The metal layer is formed, for example, by sputtering. The metal layer has a thickness of, for example, 200 nm. A photoresist 101 is formed on the formed metal layer. The metal layer is microfabricated by photolithography and selective etching using the photoresist 101 to form an infrared reflection film 23, a first readout terminal 22A, and a second readout terminal 22B.

Figure 20B:
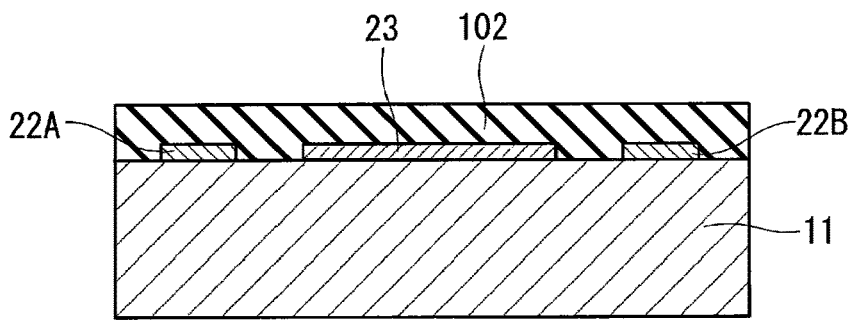
FIG. 20B is a schematic cross-sectional diagram for explaining the example of the method of manufacturing the infrared sensor of the present disclosure.

FIG. 20B: The photoresist 101 is removed. A sacrificial layer 102 is formed so as to cover the infrared reflection film 23, the first readout terminal 22A, and the second readout terminal 22B. The sacrificial layer 102 is, for example, a SiO$_2$ layer. The sacrificial layer 102 is formed, for example, by CVD. The sacrificial layer 102 has a thickness, for example, larger than or equal to 1 μm and smaller than or equal to 4 μm. The thickness of the sacrificial layer 102 corresponds to the separation distance between the infrared receiver 12 and the base substrate 11 in the infrared sensor 1A manufactured in this method. The separation distance is, more specifically, the distance between the upper surface 14 of the base substrate 11 and the lower surface of the light-receiver supporting film 18.

Figure 20C:
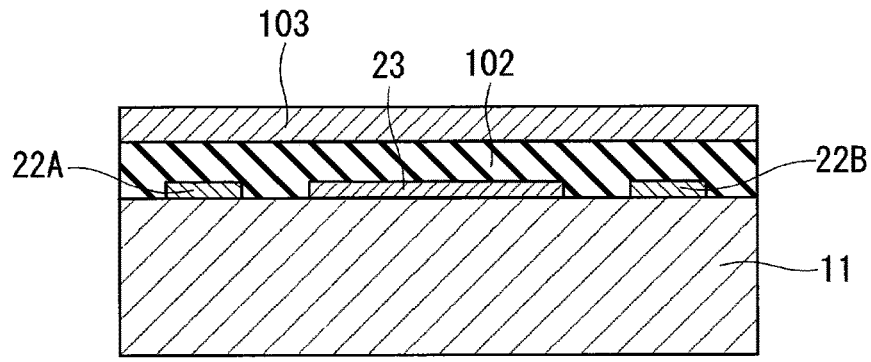
FIG. 20C is a schematic cross-sectional diagram for explaining the example of the method of manufacturing the infrared sensor of the present disclosure.

FIG. 20C: A semiconductor layer 103 is formed on the sacrificial layer 102. The semiconductor layer 103 is, for example, a SiN layer. The semiconductor layer 103 is formed, for example, by CVD. The semiconductor layer 103 has a thickness of, for example, 100 nm. The semiconductor layer 103 is used to form the first beam 13A, the second beam 13B, and the light-receiver supporting film 18 by microfabrication and pattern forming that are performed later.

Figure 20D:
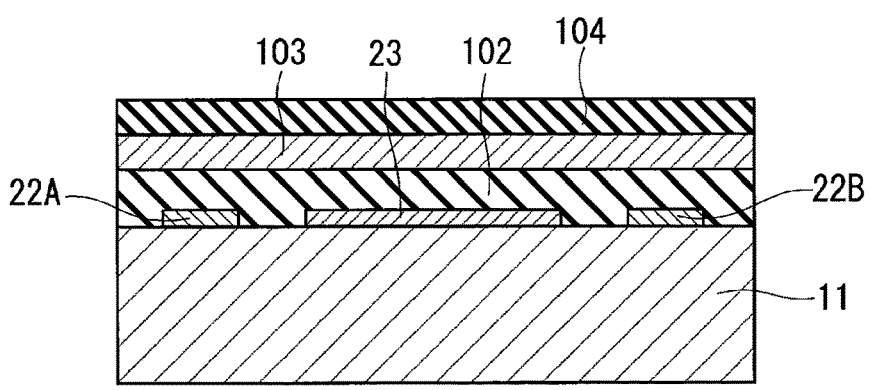
FIG. 20D is a schematic cross-sectional diagram for explaining the example of the method of manufacturing the infrared sensor of the present disclosure.

FIG. 20D: A hardware mask 104 is formed on the semiconductor layer 103. The hardware mask 104 is, for example, a SiO$_2$ layer. The hardware mask 104 is formed, for example, by CVD. The hardware mask 104 has a thickness of, for example, 30 nm. The hardware mask 104 is used to form the phononic crystal structure A in the semiconductor layer 103.

Figure 20E:
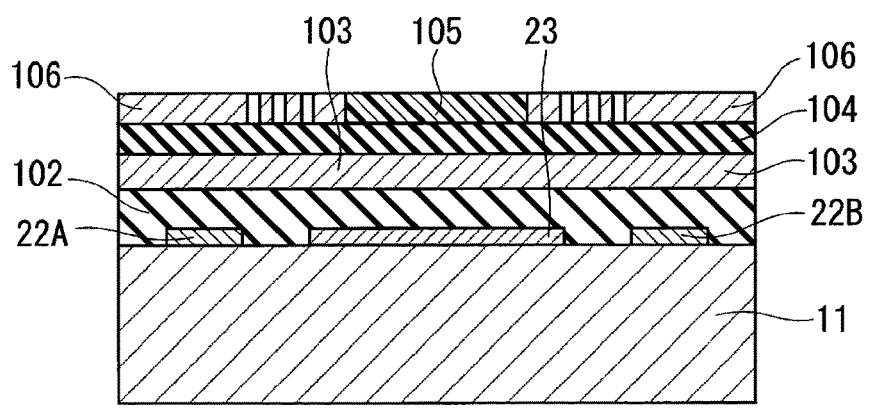
FIG. 20E is a schematic cross-sectional diagram for explaining the example of the method of manufacturing the infrared sensor of the present disclosure.

FIG. 20E: A photoresist 105 is formed on the hardware mask 104. The regions of the hardware mask 104 corresponding in plan view to the regions where the phononic crystal structure A is to be formed in the semiconductor layer 103 are exposed by photolithography. Next, a block copolymer self-assembly film 106 is formed on the exposed regions of the hardware mask 104. The self-assembly film 106 is used for block copolymer lithography to form the phononic crystal structure A.

Figure 20F:
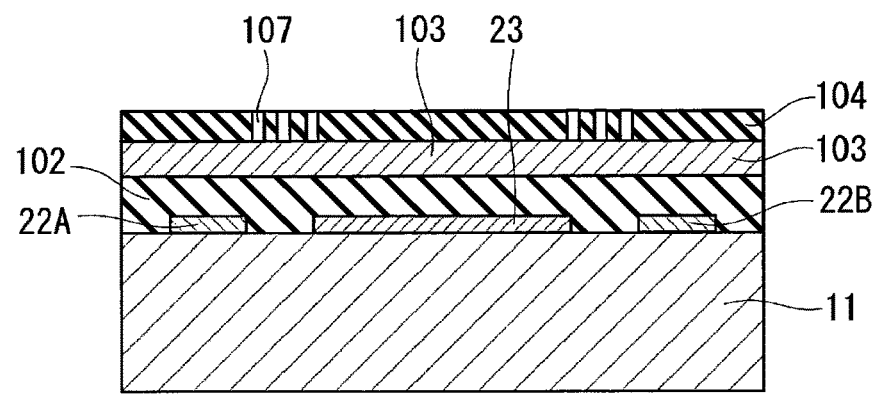
FIG. 20F is a schematic cross-sectional diagram for explaining the example of the method of manufacturing the infrared sensor of the present disclosure.

FIG. 20F: By the block copolymer lithography, a plurality of orderly arranged through holes 107 are formed in the hardware mask 104. The self-assembly film 106 and the photoresist 105 are removed.

Figure 20G:
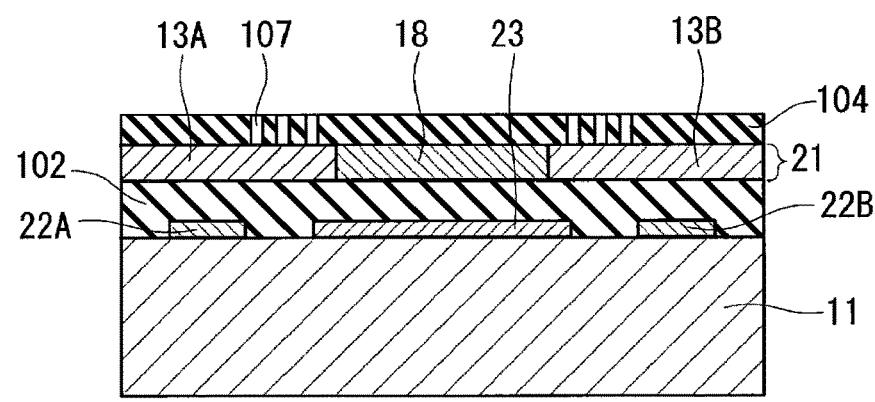
FIG. 20G is a schematic cross-sectional diagram for explaining the example of the method of manufacturing the infrared sensor of the present disclosure.

FIG. 20G: Microfabrication and pattern forming are performed on the semiconductor layer 103 by photolithography to form a first beam 13A, a second beam 13B, and a light-receiver supporting film 18. The first beam 13A, the second beam 13B, and the light-receiver supporting film 18 are included in a single-layered semiconductor layer 21.

Figure 20H:
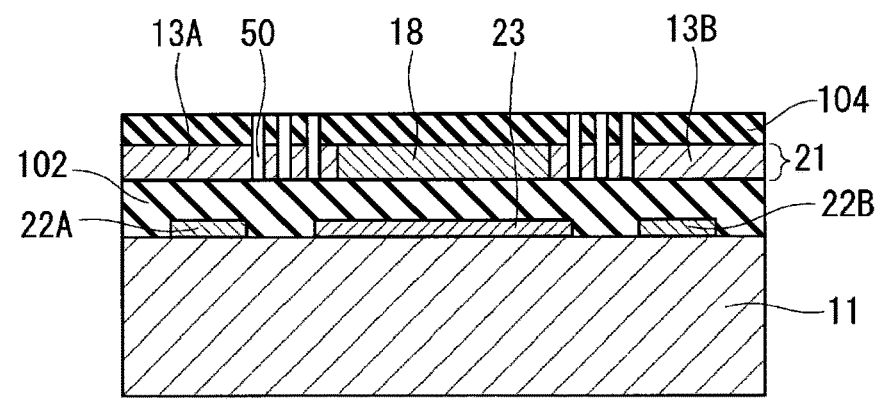
FIG. 20H is a schematic cross-sectional diagram for explaining the example of the method of manufacturing the infrared sensor of the present disclosure.

FIG. 20H: By selective etching using the hardware mask 104 as a resist, a plurality of orderly arranged through holes 50 are formed in the first beam 13A and the second beam 13B at positions corresponding to the through holes 107 in plan view. With the formed through holes 50, the phononic crystal structure A is formed.

Figure 20I:
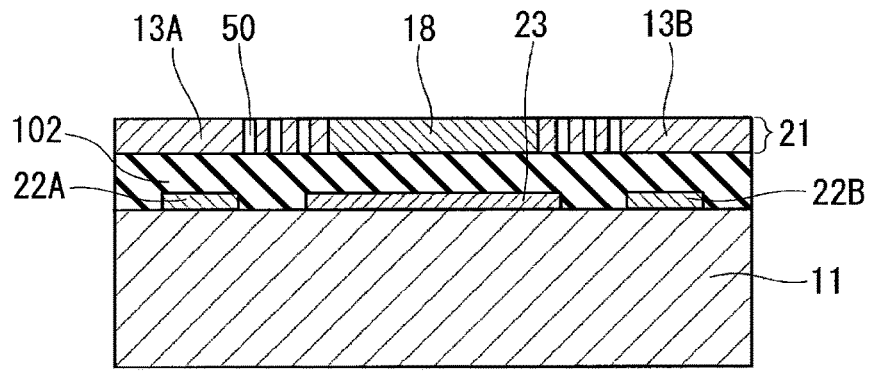
FIG. 20I is a schematic cross-sectional diagram for explaining the example of the method of manufacturing the infrared sensor of the present disclosure.

FIG. 20I: The hardware mask 104 is removed.

Figure 20J:
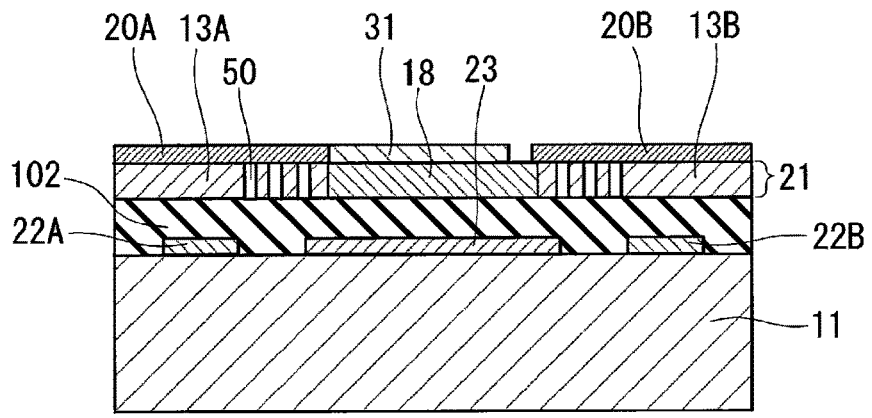
FIG. 20J is a schematic cross-sectional diagram for explaining the example of the method of manufacturing the infrared sensor of the present disclosure.

FIG. 20J: First wiring 20A, second wiring 20B, and a lower electrode 31 are formed on the first beam 13A, the second beam 13B, and the light-receiver supporting film 18. The first wiring 20A, the second wiring 20B, and the lower electrode 31 include, for example, TiN. The first wiring 20A, the second wiring 20B, and the lower electrode 31 are formed, for example, by sputtering. These members have a thickness of, for example, 8 nm.

Figure 20K:
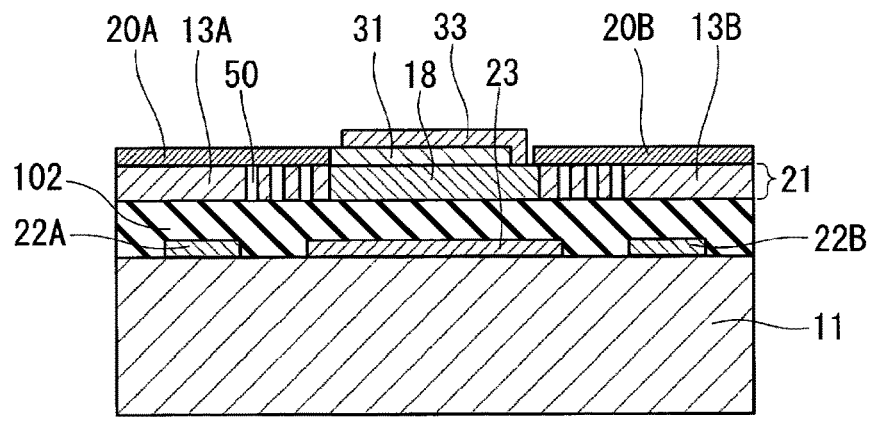
FIG. 20K is a schematic cross-sectional diagram for explaining the example of the method of manufacturing the infrared sensor of the present disclosure.

FIG. 20K: A resistance change film 33 is formed on the lower electrode 31. The resistance change film 33 includes, for example, an amorphous Si. The resistance change film 33 is formed, for example, by CVD. The resistance change film 33 has a thickness of, for example, 100 nm.

Figure 20L:
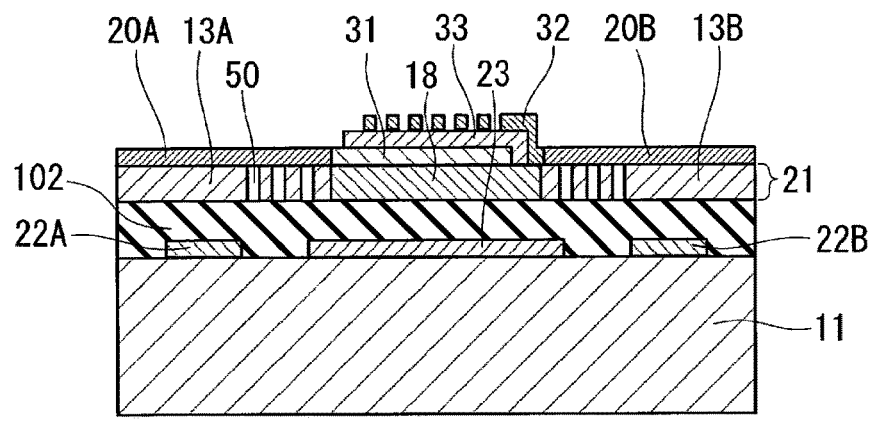
FIG. 20L is a schematic cross-sectional diagram for explaining the example of the method of manufacturing the infrared sensor of the present disclosure.

FIG. 20L: An upper electrode 32 is formed on the resistance change film 33 to be connected to the second wiring 20B. The upper electrode 32 includes, for example, TiN. The upper electrode 32 is formed, for example, by sputtering. The upper electrode 32 has a thickness of, for example, 8 nm.

Figure 20M:
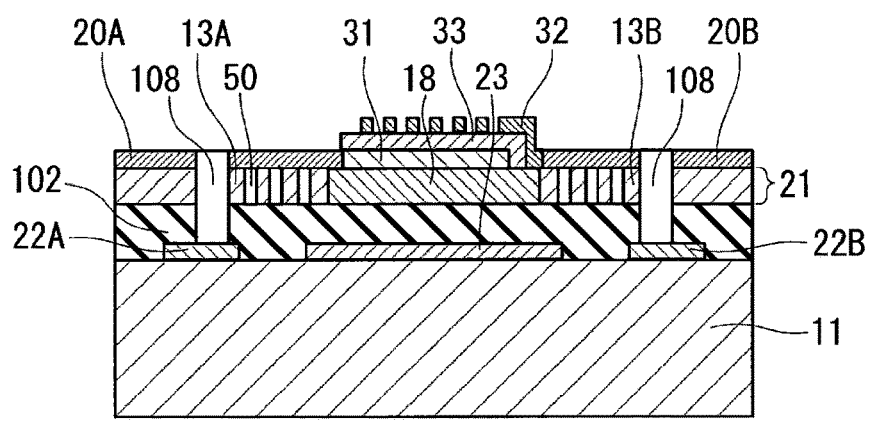
FIG. 20M is a schematic cross-sectional diagram for explaining the example of the method of manufacturing the infrared sensor of the present disclosure.

FIG. 20M: Contact holes 108 are formed through the first wiring 20A, the second wiring 20B, the first beam 13A, the second beam 13B, and the sacrificial layer 102 by selective etching to expose parts of the first readout terminal 22A and the second readout terminal 22B.

Figure 20N:
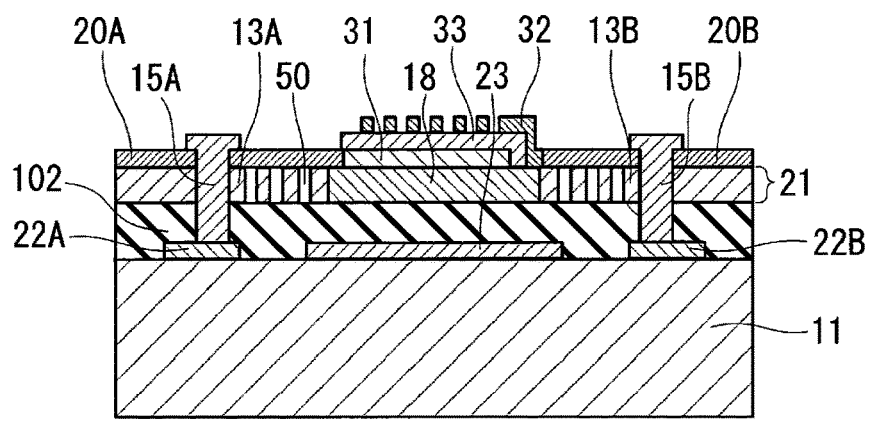
FIG. 20N is a schematic cross-sectional diagram for explaining the example of the method of manufacturing the infrared sensor of the present disclosure.

FIG. 20N: Metal is deposited in the formed contact holes 108 to form a first prop 15A and a second prop 15B. The metal used for the deposition is, for example, Al. The first prop 15A and the second prop 15B are formed, for example, by sputtering.

Figure 20O:
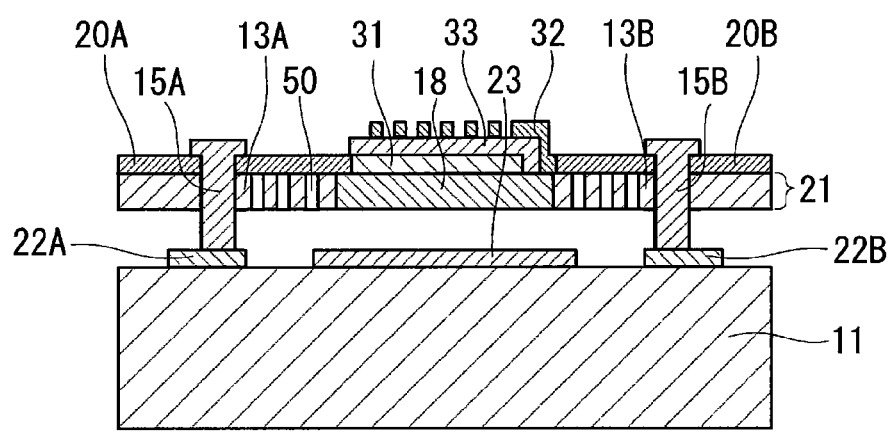
FIG. 20O is a schematic cross-sectional diagram for explaining the example of the method of manufacturing the infrared sensor of the present disclosure.

FIG. 20O: The sacrificial layer 102 is removed, for example, by vapor phase hydrogen fluoride (HF) etching. Through these processes, the infrared sensor 1A, which is an embodiment of the infrared sensor of the present disclosure, is manufactured. Note that an insulation layer 26 can be formed by performing pattern etching on the sacrificial layer 102.

INDUSTRIAL APPLICABILITY

The infrared sensor of the present disclosure can be used for various applications including ones for conventional infrared sensors.

What is claimed is:

1. An infrared sensor comprising:
a base substrate;
a bolometer infrared receiver;
a first beam;
a second beam;
first wiring;
second wiring; and
an infrared reflection film, wherein:
each of the first beam and the second beam has a connection portion connected to the base substrate and/or a member on the base substrate and a separated portion away from the base substrate, and is physically joined to the infrared receiver at the separated portion,
the infrared receiver is supported by the first beam and the second beam to be away from the base substrate,
the infrared receiver includes a lower electrode, an upper electrode, and a resistance change film including a resistance change material an electrical resistance of which changes with temperature,
the resistance change film is sandwiched by the lower electrode and the upper electrode in a thickness direction,
each of the lower electrode and the upper electrode is electrically connected to the resistance change film,
the lower electrode and the upper electrode are electrically connected to the first wiring and the second wiring, respectively,
the lower electrode has a first line-and-space structure,
the upper electrode has a second line-and-space structure,
an alignment direction of the first line-and-space structure and an alignment direction of the second line-and-space structure are different from each other in plan view, and
the infrared reflection film is provided at a position on a surface of the base substrate facing the infrared receiver.

2. The infrared sensor according to claim 1, wherein an angle formed by the alignment direction of the first line-and-space structure and the alignment direction of the second line-and-space structure is larger than or equal to 80 degrees and smaller than or equal to 90 degrees.

3. The infrared sensor according to claim 1, wherein the alignment direction of the first line-and-space structure and the alignment direction of the second line-and-space structure are orthogonal to each other.

4. The infrared sensor according to claim 1, wherein a line width and an interval of at least one of the first line-and-space structure or the second line-and-space structure is smaller than or equal to 1 µm.

5. The infrared sensor according to claim 1, wherein each of the lower electrode and the upper electrode includes a metal film, and an effective sheet resistance of the metal film is larger than or equal to 100Ω/☐ and smaller than or equal to 500Ω/☐.

6. The infrared sensor according to claim 1, wherein the resistance change film includes silicon or vanadium oxide.

7. The infrared sensor according to claim 1, wherein the first beam and the second beam include silicon or vanadium oxide.

8. The infrared sensor according to claim 1, wherein the first wiring is formed on the first beam, and the second wiring is formed on the second beam.

9. The infrared sensor according to claim 1, further comprising:
a first prop and a second prop disposed on the base substrate and extending in a direction away from an upper surface of the base substrate, wherein
the first beam is physically connected to the first prop at the connection portion,
the second beam is physically connected to the second prop at the connection portion,
the infrared receiver, the first beam, and the second beam are suspended over the base substrate by the first prop and the second prop in cross-sectional view,
the first prop and the second prop are electrically conductive,
the first wiring is electrically connected to the first prop, and
the second wiring is electrically connected to the second prop.

10. The infrared sensor according to claim 1, wherein the base substrate has a recess,
the recess is positioned between the base substrate and the infrared receiver, the separated portion of the first beam, and the separated portion of the second beam,
each of the first beam and the second beam is physically connected to the base substrate at the connection portion, and
the infrared receiver, the separated portion of the first beam, and the separated portion of the second beam are suspended over the recess of the base substrate in cross-sectional view.

11. The infrared sensor according to claim 1, further comprising:
a readout integrated circuit (ROIC) inside the base substrate.

12. The infrared sensor according to claim 1, wherein a section of the first beam, the section being between a portion joined to the infrared receiver and the connection portion, has a first phononic crystal structure having a plurality of through holes that are orderly arranged, and
a section of the second beam, the section being between a portion joined to the infrared receiver and the connection portion, has a second phononic crystal structure having a plurality of through holes that are orderly arranged.

13. The infrared sensor according to claim 12, wherein the first phononic crystal structure includes a first domain and a second domain which are phononic crystal regions,
through holes of the through holes included in the first domain are orderly arranged in a first direction in plan view, through holes of the through holes included in the second domain are orderly arranged in a second direction in plan view, the second direction being different from the first direction, the second phononic crystal structure includes a third domain and a fourth domain which are phononic crystal regions, through holes of the through holes included in the third domain are orderly arranged in a third direction in plan view, and through holes of the through holes included in the fourth domain are orderly arranged in a fourth direction in plan view, the fourth direction being different from the third direction.

14. An infrared sensor array comprising:

a plurality of infrared sensors arranged in a two-dimensional array, wherein the infrared sensors include the infrared sensor according to claim 1.

15. An infrared sensor comprising:

a base substrate;

a bolometer infrared receiver;

a first beam; and a second beam, wherein:

each of the first beam and the second beam has a connection portion connected to the base substrate and/or a member on the base substrate and a separated portion away from the base substrate, and is physically joined to the infrared receiver at the separated portion, the infrared receiver is supported by the first beam and the second beam to be away from the base substrate, the infrared receiver includes a first metal film and a second metal film spaced apart from each other along a thickness direction of the infrared receiver, the first metal film has a first line-and-space structure, and the second metal film has a second line-and-space structure, and an alignment direction of the first line-and-space structure and an alignment direction of the second line-and-space structure are different from each other in plan view.

16. The infrared sensor according to claim 1, wherein at least one of the first line-and-space structure or the second line-and-space structure includes a bus line and a plurality of line patterns extending from one side or both sides of the bus line.

17. The infrared sensor according to claim 1, wherein at least one of the first line-and-space structure or the second line-and-space structure includes a plurality of line patterns physically and electronically separated from each other.

* * * * *